United States Patent
Huang et al.

(10) Patent No.: US 8,325,529 B2
(45) Date of Patent: Dec. 4, 2012

(54) BIT-LINE CONNECTIONS FOR NON-VOLATILE STORAGE

(75) Inventors: Chen-Che Huang, Campbell, CA (US); Chun-Ming Wang, Fremont, CA (US); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 287 days.

(21) Appl. No.: 12/813,437

(22) Filed: Jun. 10, 2010

(65) Prior Publication Data

US 2011/0026327 A1    Feb. 3, 2011

Related U.S. Application Data

(60) Provisional application No. 61/230,983, filed on Aug. 3, 2009.

(51) Int. Cl.
*G11C 16/04* (2006.01)

(52) U.S. Cl. .............. 365/185.17; 365/185.05; 257/324; 257/E21.602; 438/128; 438/266

(58) Field of Classification Search ............. 365/185.17, 365/185.05; 257/324, E21.602; 438/128, 438/266

See application file for complete search history.

(56) References Cited

U.S. PATENT DOCUMENTS

| | | | | |
|---|---|---|---|---|
| 6,888,190 B2 * | 5/2005 | Yang et al. | .................... | 257/314 |
| 6,980,471 B1 * | 12/2005 | Samachisa | ............... | 365/185.02 |
| 7,462,038 B2 | 12/2008 | Knoefler et al. | | |
| 7,615,448 B2 | 11/2009 | Higashitani | | |
| 7,638,832 B2 * | 12/2009 | Yaegashi | ........................ | 257/314 |
| 2007/0205437 A1 | 9/2007 | Amon et al. | | |
| 2009/0011558 A1 | 1/2009 | Okajima | | |
| 2009/0251967 A1 * | 10/2009 | Higashitani | .............. | 365/185.17 |

FOREIGN PATENT DOCUMENTS

WO    9718587    5/1997

OTHER PUBLICATIONS

McKee, "Lecture 26: Embedded Memory—Flash," EE241—Spring 2005, Advanced Digital Integrated Circuits.

* cited by examiner

*Primary Examiner* — Toan Le
(74) *Attorney, Agent, or Firm* — Vierra Magen Marcus & DeNiro LLP

(57) ABSTRACT

Bit line connections for non-volatile storage devices and methods for fabricating the same are disclosed. At least two different types of bit line connections may be used between memory cells and bit lines. The different types of bit line connections may be structurally different from each other as follows. One type of bit line connection may include a metal pad between an upper via and lower via. Another type of bit line connection may include an upper via and lower via, but does not include the metal pad. Three rows of bit line connections may be used to relax the pitch. For example, two rows of bit line connections on the outside may have the metal pad, whereas bit line connections in the middle row do not have the metal pad.

25 Claims, 19 Drawing Sheets

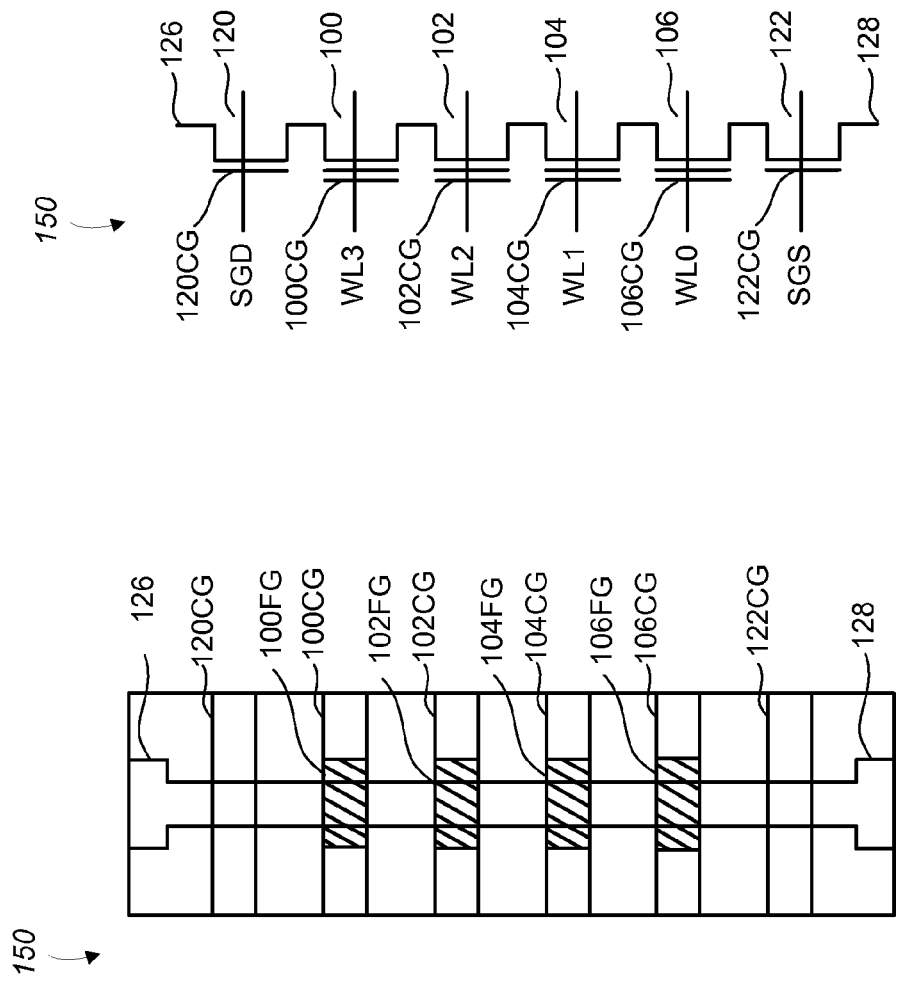

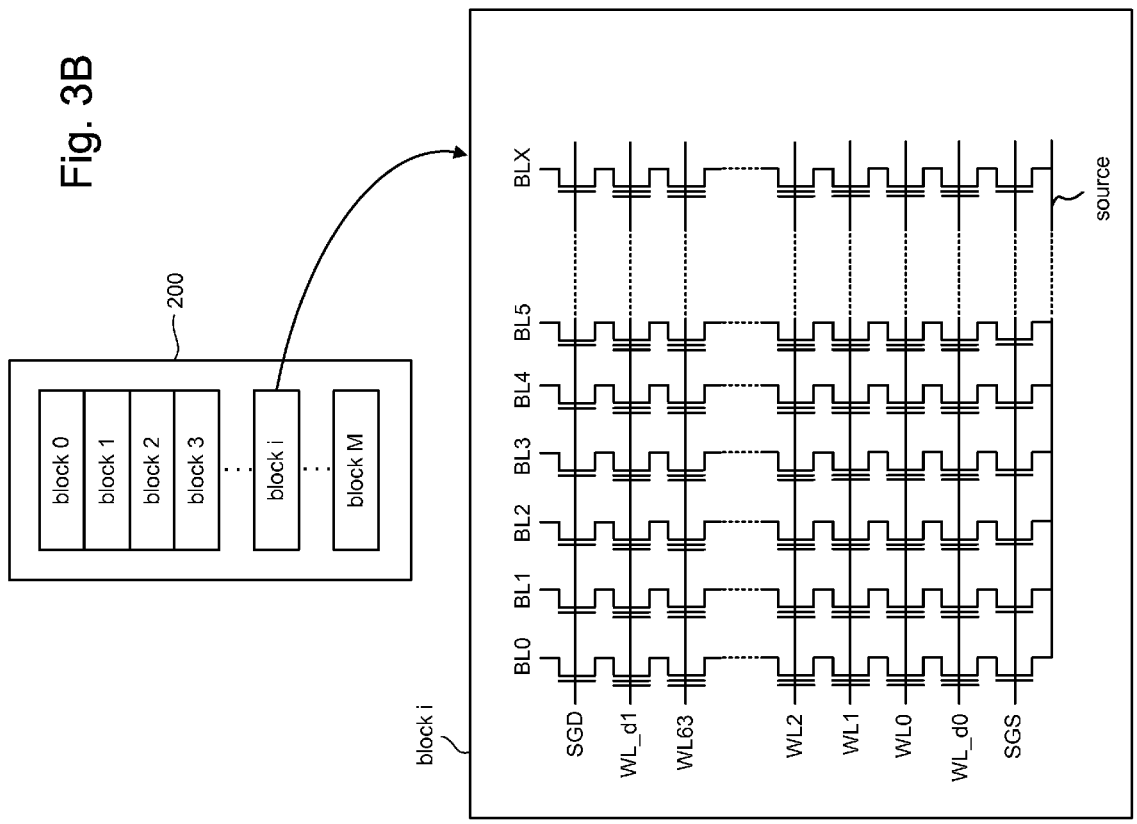

BIT-LINE CONNECTIONS FOR NON-VOLATILE STORAGE

PRIORITY

This application claims the benefit of U.S. Provisional Application No. 61/230,983, entitled "Hybrid Bit-Line Contact and Metal Contact Via Design for Non-Volatile Storage," by Chen-Che Huang et al., filed on Aug. 3, 2009, incorporated herein by reference.

BACKGROUND

The present disclosure relates to non-volatile memory structures, and more particularly, to techniques for forming electrical contacts between bit lines and storage elements in such structures.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

One type of flash memory is commonly referred to as NAND memory, which includes multiple floating gate transistors (memory cells) in series between two select gate transistors. One of the select gates connects the NAND string to a bit line through a bit line contact. Note that there may be many NAND strings that share the same bit line. For example, in some designs, a single bit line is associated with many NAND strings that run in a long line. The select gate transistors are used to select one of the NAND strings on the bit line. In some devices, a bit line contact connects the bit line to a diffusion region that is between two select gate transistors—one for each of two different NAND strings.

Typically, the memory array is arranged with a large number of parallel bit lines, along with parallel word lines that run perpendicular to the bit lines. By applying suitable voltages to the bit line and word lines the memory cells may be programmed. The memory cells may be read by applying appropriate voltages to the word lines and bit lines, and then sensing the bit lines.

As sizes of memory arrays continue to shrink, the width and pitch of bit lines continues to shrink. As a result it can be difficult to properly fabricate bit line contacts within the tight design constraints. For example, the lithographic process may have limitations on how closely the bit line contacts can be placed to one another. Therefore, if the design calls for too narrow of a pitch for the bit line contact, they may not print properly. Also, it is possible for bit line contacts to short together electrically.

However, even with state-of-the-art lithography, it can be difficult to fabricate bit line contacts. For example, some lithography techniques may be more suitable for forming dense line/spaces than for hole/pillars. For example, spacer techniques may be used to form dense line/spaces beyond the single resolution limit. Forming dense line/spaces may be suitable for forming the bit lines themselves. However, formation of the bit line contacts may require more of a hole/pillar approach. Therefore, other techniques may be needed for forming the bit line contacts.

One technique for alleviating such problems is to stagger the placement of the bit line contacts. For example, a first row of bit line contacts may be formed for odd bit lines and a second row for even bit line contacts. The two rows run parallel to one another, but have a small gap between them. The small space between the rows creates a staggering which helps to alleviate design constraints. In other words, bit line contacts for the odd bit lines are staggered from bit line contacts for the even bit lines. However, even staggering the bit line contacts may not be sufficient, especially as the size of features continues to shrink.

Therefore, improved techniques are desired for forming bit line contacts in memory arrays.

BRIEF DESCRIPTION OF THE DRAWINGS

FIG. 1 is a top view of a NAND string.

FIG. 2 is a circuit diagram of the NAND string of FIG. 1.

FIG. 3B shows more details of block of a memory array.

DETAILED DESCRIPTION

Figure 3A:
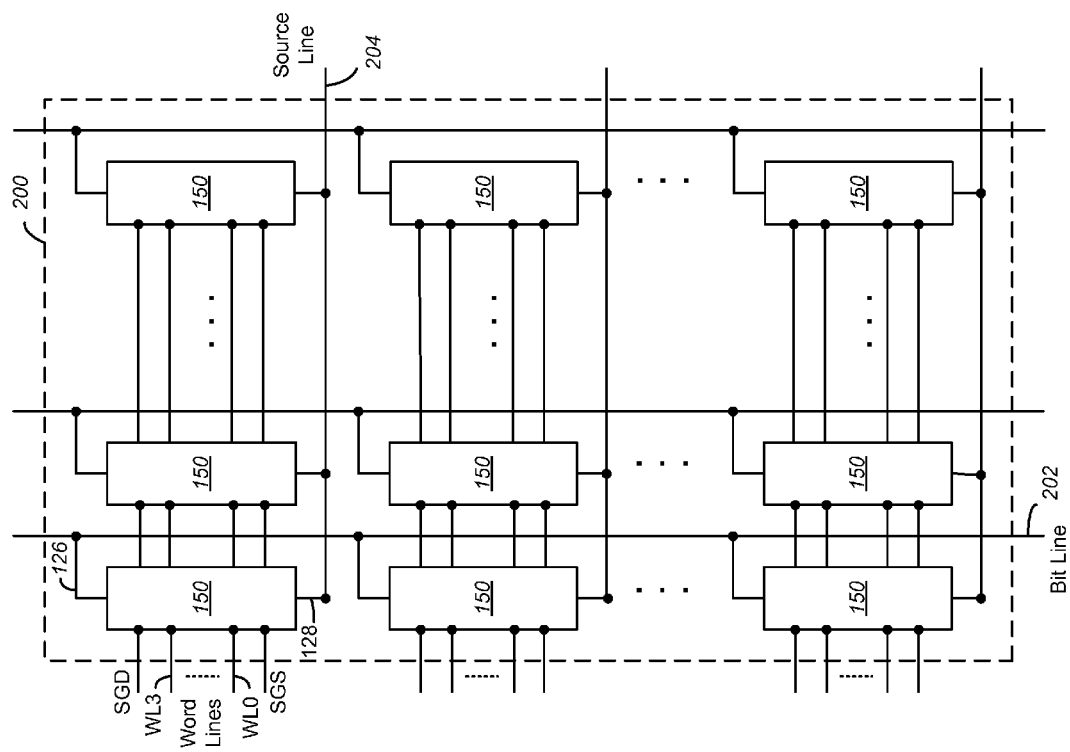
FIG. 3A illustrates one embodiment of an array of NAND strings.

In some embodiments, at least two different types of bit line connections are used between the memory cells and the bit lines. The different types of bit line connections may be structurally different from each other as follows. One type of bit line connection may include a metal pad between an upper via and a lower via. Another type of bit line connection may include an upper via and lower via, but does not include the metal pad. In some embodiments, three rows of bit line connections are used to relax the pitch. For example, two rows of bit line connections on the outside have the metal pad, whereas bit line connections in the middle row do not have the metal pad.

Because the different types of bit line connections are structurally different the capacitance between the bit line connection and nearby elements such as select gate transistors may be different. However, uneven capacitance, which might otherwise compromise performance, is avoided due to the structural arrangement of the bit line connections.

In some embodiments, the metal pad is formed in a source line metal layer (e.g., some NAND designs have a source line metal layer). Therefore, the bit line connections do not require any additional metal layers not already used in the memory array. The bit line connections may be formed without using any spacer techniques. Moreover, bit line connections may be formed using single exposure lithography. Therefore, techniques for fabricating bit line connections are compatible with existing lithography techniques and are cost effective.

In some embodiments, the bit line connections are used in a NAND memory array. Therefore, an example NAND architecture will be discussed. However, embodiments are not limited to NAND architectures. A NAND structure may include multiple floating gate transistors in series between two select gate transistors. The floating gate transistors in series and the select gates are referred to as a NAND string. For example, FIG. 1 is a top view showing one NAND string 150, and FIG. 2 is an equivalent circuit thereof.

The NAND string depicted in FIG. 1 and FIG. 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

A typical architecture for a flash memory system using a NAND structure may include many NAND strings. Each NAND string may be connected to the source line by its source select gate controlled by select line SGS and connected to its associated bit line by its drain select gate controlled by select line SGD. Each bit line and the respective NAND string(s) that are connected to that bit line via a bit line connection comprise the columns of the array of memory cells. Bit lines are shared with multiple NAND strings. Typically, the bit line runs on top of the NAND strings in a direction perpendicular to the word lines and is connected to one or more sense amplifiers.

Each memory cell can store data represented in analog or digital form. When storing one bit of digital data, the possible threshold voltages of the memory cell are divided into two ranges, which are assigned the logical data values "1" and "0." In one example of a NAND-type flash memory, the threshold voltage is negative after the memory cell is erased, and this state is defined as logic "1." The threshold voltage is positive after a program operation, and this state is defined as logic "0." When the threshold voltage is negative and a read is attempted by applying 0 volts to the control gate, the memory cell turns on to indicate logic 1 is stored. When the threshold voltage is positive and a read operation is attempted by applying 0 volts to the control gate, the memory cell does not turn on, which indicates that logic 0 is stored. A memory cell storing one bit of digital data is referred to as a binary memory cell.

A memory cell can also store multiple bits of digital data, and such a cell is referred to as a multi-state or multi-level memory cell. The threshold voltages for a multi-state memory cell are divided into a number of states. For example, if four states are used, there will be four distinct ranges or distributions of threshold voltages, which are assigned the logical data values "11," "10," "01," and "00." In one example of a NAND-type memory having four states, the threshold voltage after an erase operation is negative and defined as the logic "11." Three distinct ranges of positive threshold voltages are defined as logic "10," "01," and "00."

Examples of NAND-type flash memories and their operation are provided in the following patents, all of which are incorporated herein by reference in their entirety: U.S. Pat. No. 5,386,422; U.S. Pat. No. 5,570,315; U.S. Pat. No. 5,774,397; U.S. Pat. No. 6,046,935; U.S. Pat. No. 6,456,528; and U.S. Pat. No. 6,522,580.

FIG. 3A illustrates one embodiment of an array 200 of NAND strings 150. Along each column, a bit line 202 is coupled to the drain regions 126 of select gates 120. The subject of this disclosure is the formation of bit line connections, as described below. Along each row, a source line 204 may be coupled to the source regions 128 of select gates 122. Examples of a NAND architecture array and its operation as part of a memory system may be found in U.S. Pat. No. 5,570,315, U.S. Pat. No. 5,774,397, and U.S. Pat. No. 6,046,935.

The memory array 200 is typically divided into a large number of blocks of memory cells. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller (described below) calculates the ECC parity when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 3B shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 4:
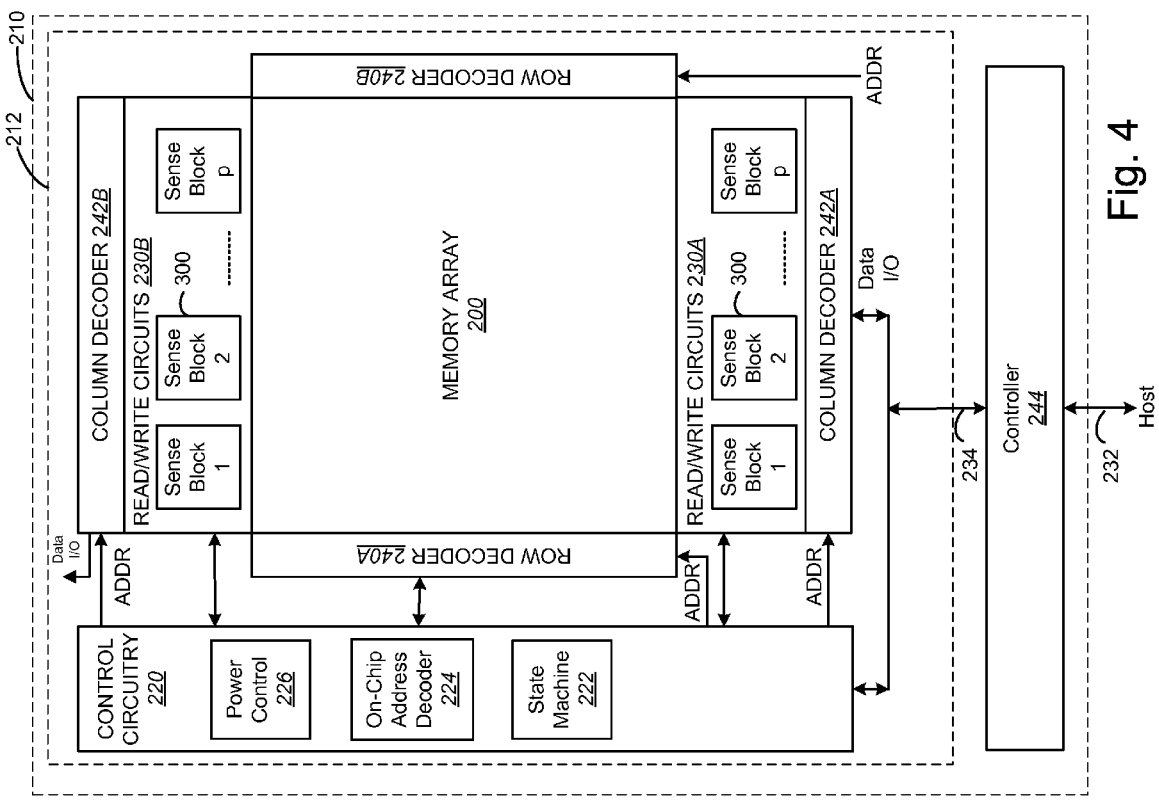
FIG. 4 is a block diagram depicting one embodiment of a memory array.

FIG. 4 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 5:
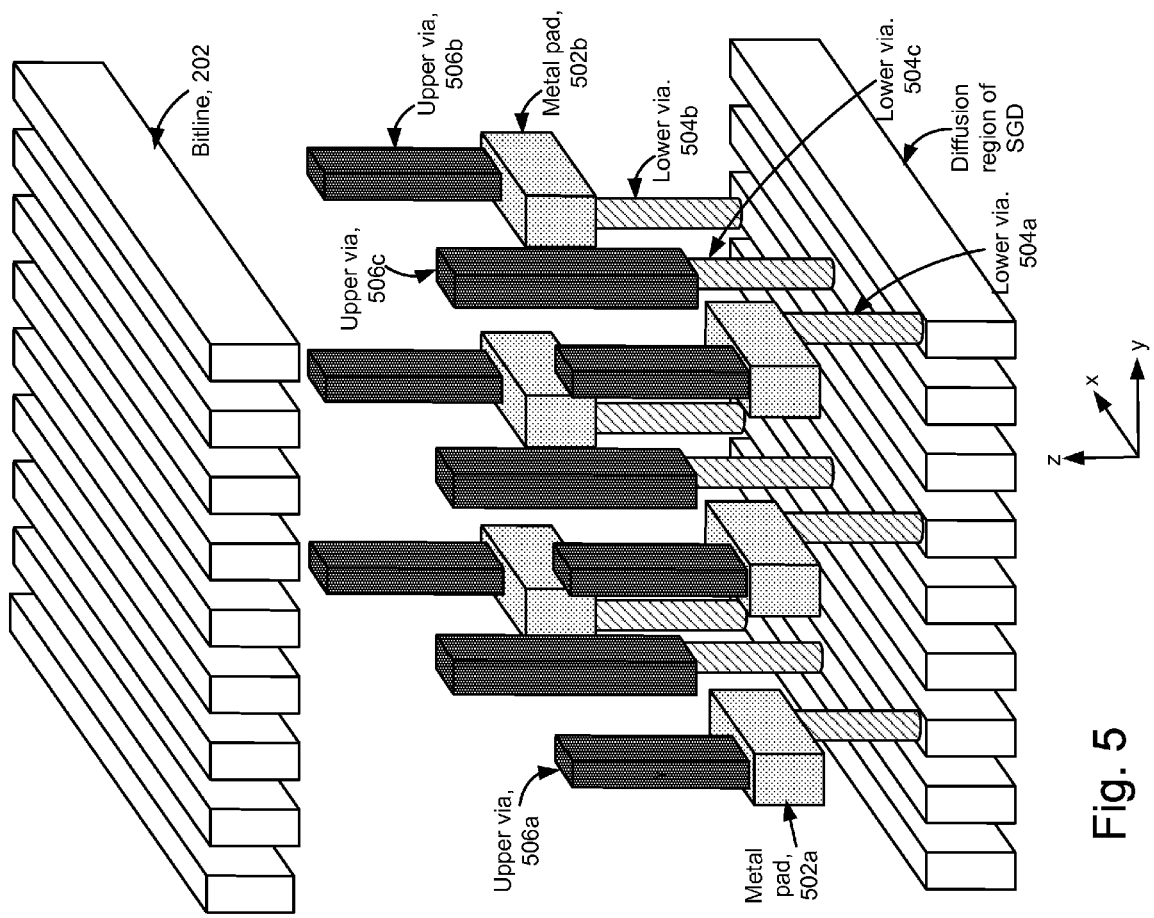
FIG. 5 depicts one embodiment of bit line connections, showing three types of connections between bit lines and memory cells.
Figure 6:
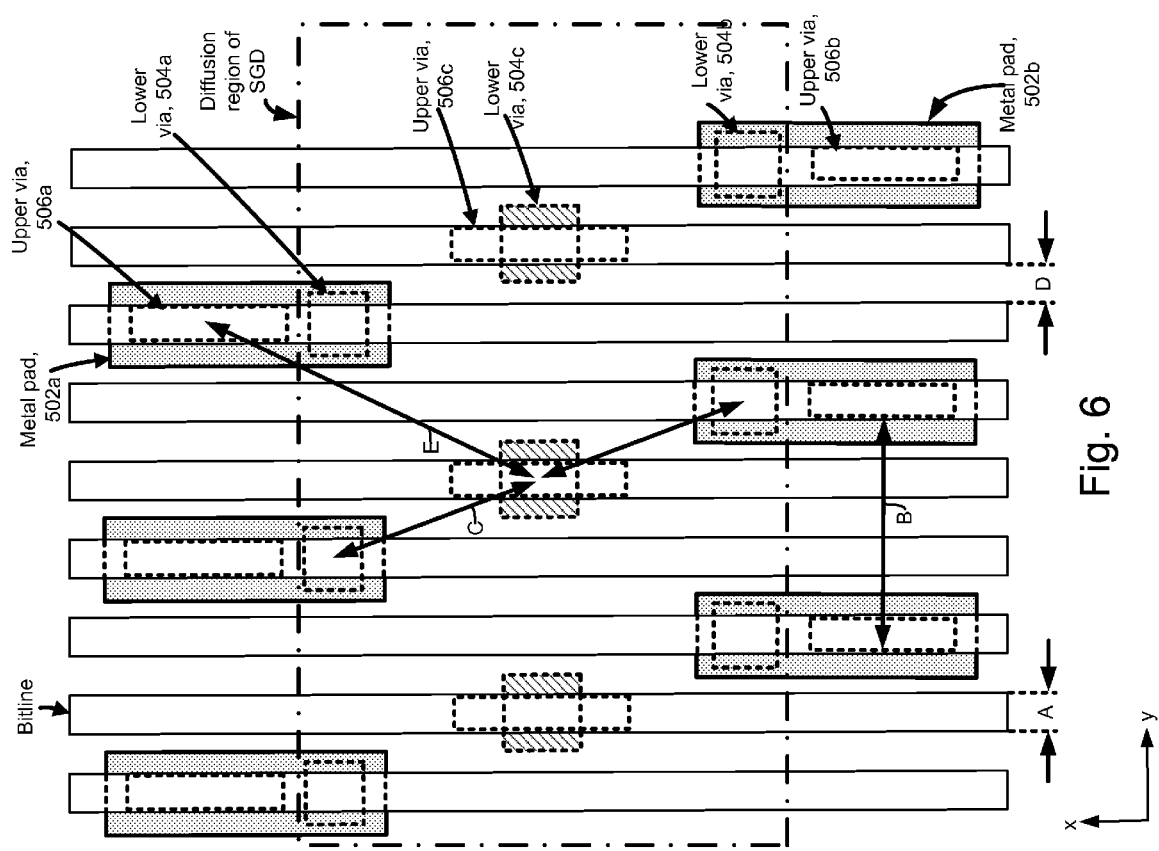
FIG. 6 depicts a top view of the embodiment of FIG. 5.

FIG. 5 depicts a perspective exploded view of one embodiment of bit line connections, showing three types of connections between bit lines and memory cells. FIG. 6 depicts a top view of the embodiment of FIG. 5. The first type (Type I) and the third type (Type III) of bit line connections each include three portions: an upper portion 506a, 506b (or upper via), a middle portion (or metal pad) 502a, 502b, and a lower portion 504a, 504b (or lower via). The second type of bit line connection (Type II) includes an upper portion 506c (or upper via) and a lower portion 504c (or lower via), but does not include a metal pad. Each lower via 504 is connected to a diffusion region of a select gate transistor. Each upper via 506 connects to one of the bit lines 202. However, so that the bit line connections can be seen clearly, FIG. 5 shows an exploded view in which the bit lines 202 are not in contact with the upper vias 506. In some embodiments, the diffusion regions are in a substrate, the metal pads 502 are in a one metal layer (e.g., metal 0) and the bit lines 202 are in another metal layer (e.g., metal 1).

Note that the bit line connections alternate sequentially between a Type I, Type, II, and Type III connection moving from one bit line 202 to the next. Also note that the Type I connections are located in one row, the Type II connections are located in another row, and the Type III connections are located in still another row. Each row has a small space between them. Therefore, the bit line connections are staggered to allow a greater space between the connections. In other words, the pitch between bit line connections is relaxed.

In one embodiment, the upper via 506c is more or less centered over the lower via 504c for Type II bit line connections. Of course, there may be some misalignment such that the upper portion is not directly centered over the lower portion. However, for Type I and Type III bit line connections, the metal pad 502 allows the upper via 506a, 506b to be offset from the lower via 504a, 504b. This allows for greater separation between the upper via 506a, 506b of a Type I or II bit line connection and the upper via 506c of a type II bit line connection.

The top view of FIG. 6 shows that each bit line 202 has a width of "A" nanometers (nm) and the spaces between bit lines may is "D" nanometers (nm). Embodiments disclosed herein are able to fabricate bit line connections for bit lines having very small dimensions. For example, the bit line may be 19 nm wide, or even smaller. In some embodiments, "A" and "D" are the same width. The upper vias 506 have a pitch of "B" nm in the example of FIG. 6. In some embodiments, B is about 114 nm. The distance between centers of a lower via 504a of a type I connection and a lower via 504c of a type II connection is "C" nm in the example of FIG. 6. In some embodiments, C is about 106 nm.

The relative shapes of the different portions of the bit line connections of one embodiments will now be discussed. The lower vias 504 may be somewhat wider in the y-direction than the upper vias 506, although this is not a requirement. The upper vias 506 may be somewhat longer than the lower vias 504 in the x-direction (or bit line direction). This configuration may assist obtaining a good electrical contact between the upper vias 506c and lower vias 504c of type II connections in the event that there is some mis-alignment between the lower and upper vias 504, 506 or if one of the vias is not shaped properly. Note that in some embodiments, the lower vias 504 may taper somewhat such that they are more narrow at the bottom. Thus, the lower vias 504 may be wider at the point that contacts the upper vias 506c or metal pads 502 than the point that contacts the SGD diffusion region.

Note that for type I and III connections, the upper vias 506a, 506b do not contact the lower vias 502a, 502b. Instead a metal pad 502a, 502b makes the electrical connection between the upper and lower vias. In some embodiments, the metal pads 502 are somewhat wider in the y-direction than the lower vias 504, which may help to achieve a good electrical connection in the event of misalignment or other problems. Having relatively wide metal pads 502 may also help with the fabrication process, as forming wider metal pads 502 may avoid or reduce lithography constraints. Note that since the metal pads 502 in a given row are only on every third bit line in some embodiments, they can be relatively wide without running into a problem of shorting them together electrically. Moreover, in some embodiments, all of the metal pads 502 are formed in the same metal layer. In some embodiments, the metal pads 502 are formed in the same metal layer as a common source line. Therefore, no additional metal layer is needed to form the metal pads 502.

The metal pads 502a, 502b extend away from the lower vias 504a, 504b of type I and III connections in a direction away from the type II connections. This allows the upper vias 506a, 506b of type I and III connections to be formed further from the upper vias 506c of the type II connections. For example, the central axis of a lower via 504a of a type I connection is "C" nm from the central axis of a lower via 504c of a type II connection. Likewise, the central axis of a lower via 504b of a type III connection is "C" nm from the central axis of a lower via 504c of a type II connection. However, the central axis of the upper via 506a of the type I connection is "E" nm from the central axis of an upper via 506c of a type II connection, which is clearly much larger than "C" nm. This may assist in allowing the upper vias 506 to be longer than the lower vias 504 in the bit line direction. As previously mentioned, this may aid in allowing proper electrical connection. Also note that proper spacing should be maintained between upper vias 506 to avoid shorting two connections together. Moreover, the spacing between the upper vias 506 may aid in printing holes for the vias 506 during the lithography process. In some embodiments, holes for upper vias 506 for all three types (I, II, III) of bit line connections are formed using a single lithographic exposure. Also note that illumination density differences may cause the middle row of connection type (e.g., Type II) to be larger than the other rows (e.g., Type I or III). The design depicted in FIGS. 5 and 6 may help the middle row overlap margin.

A further note on the upper vias 506c of the type II connections is that by forming them relatively narrow (e.g., about the same width as a bit line in some embodiments) possible shorting between those upper vias 506c and the metal pads 502 may be reduced or eliminated. For example, if the upper vias 506c of the type II connections were formed properly aligned in the y-direction, but mis-aligned in the x-direction, then they will not short with the metal pads 502. In other words, there must be misalignment in two directions for there to be shorting. Also, note that the upper vias 506c of the type II connections are relatively close in the y-direction to the type I connection, but are relatively far from the type III connections in the y-direction. Therefore, there is yet another protection against possible shorting.

Figure 7A:
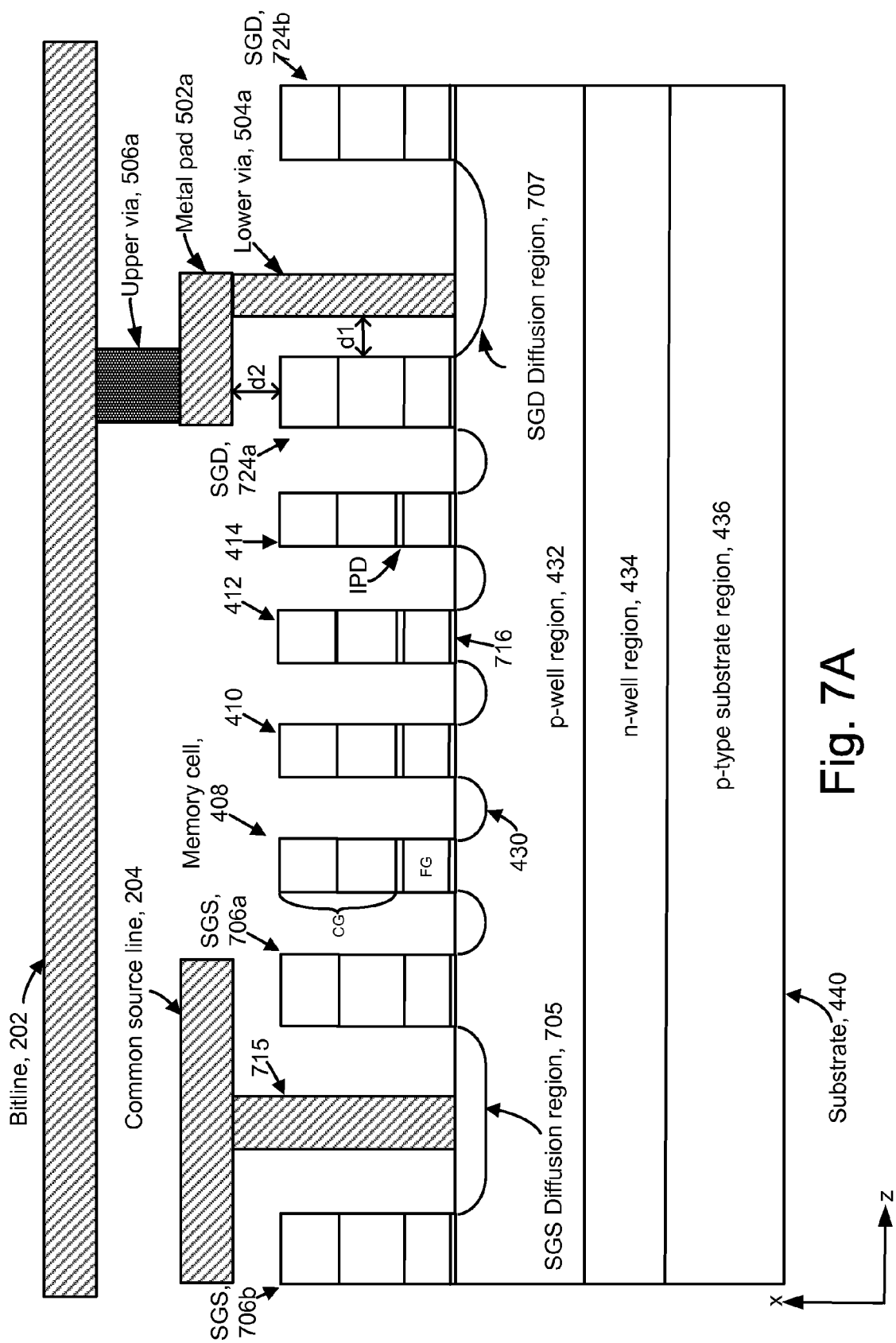
FIGS. 7A, 7B, and 7C depict a cross-sectional view of embodiments of a NAND string.
Figure 7B:
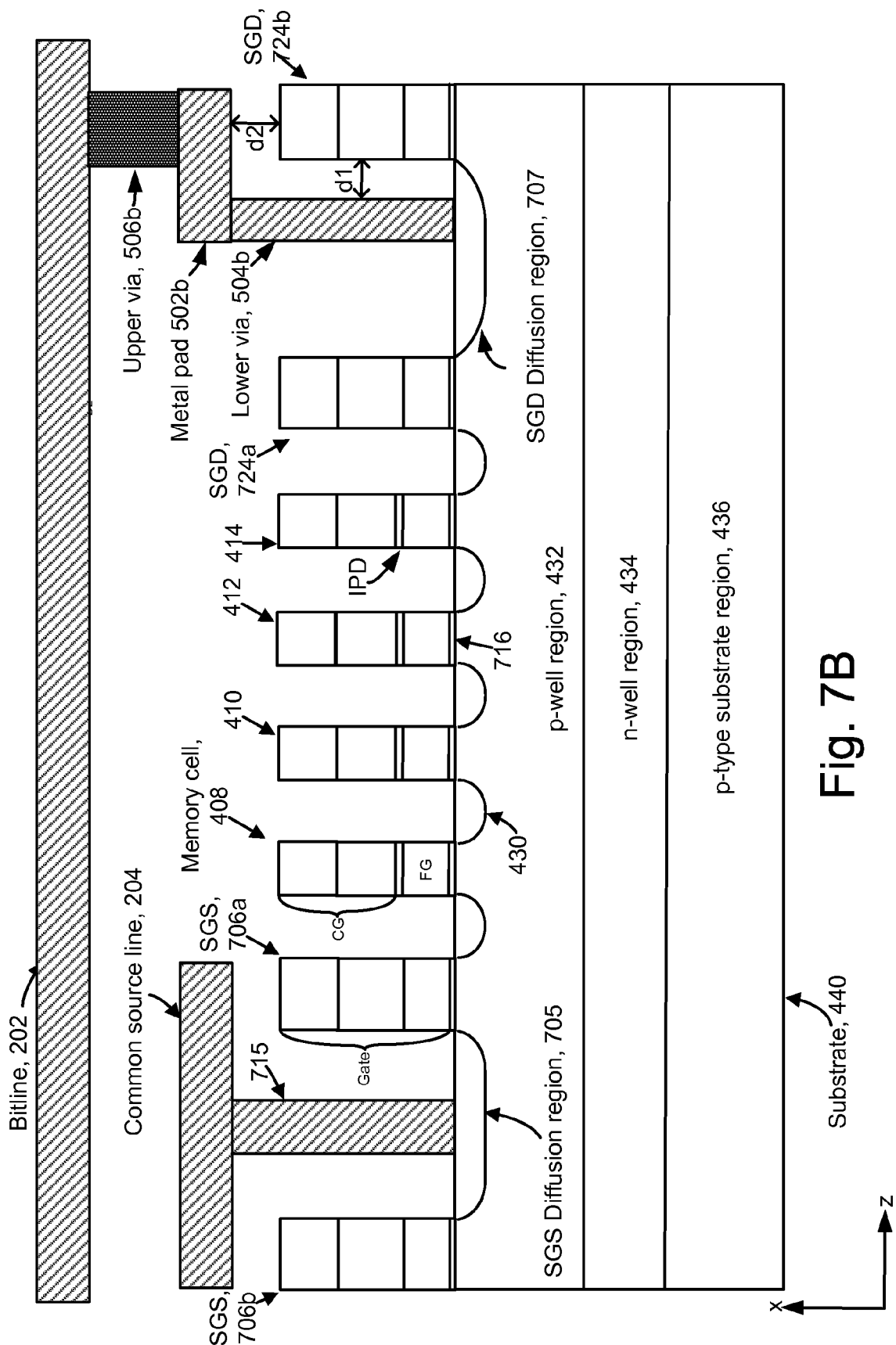
Figure 7C:
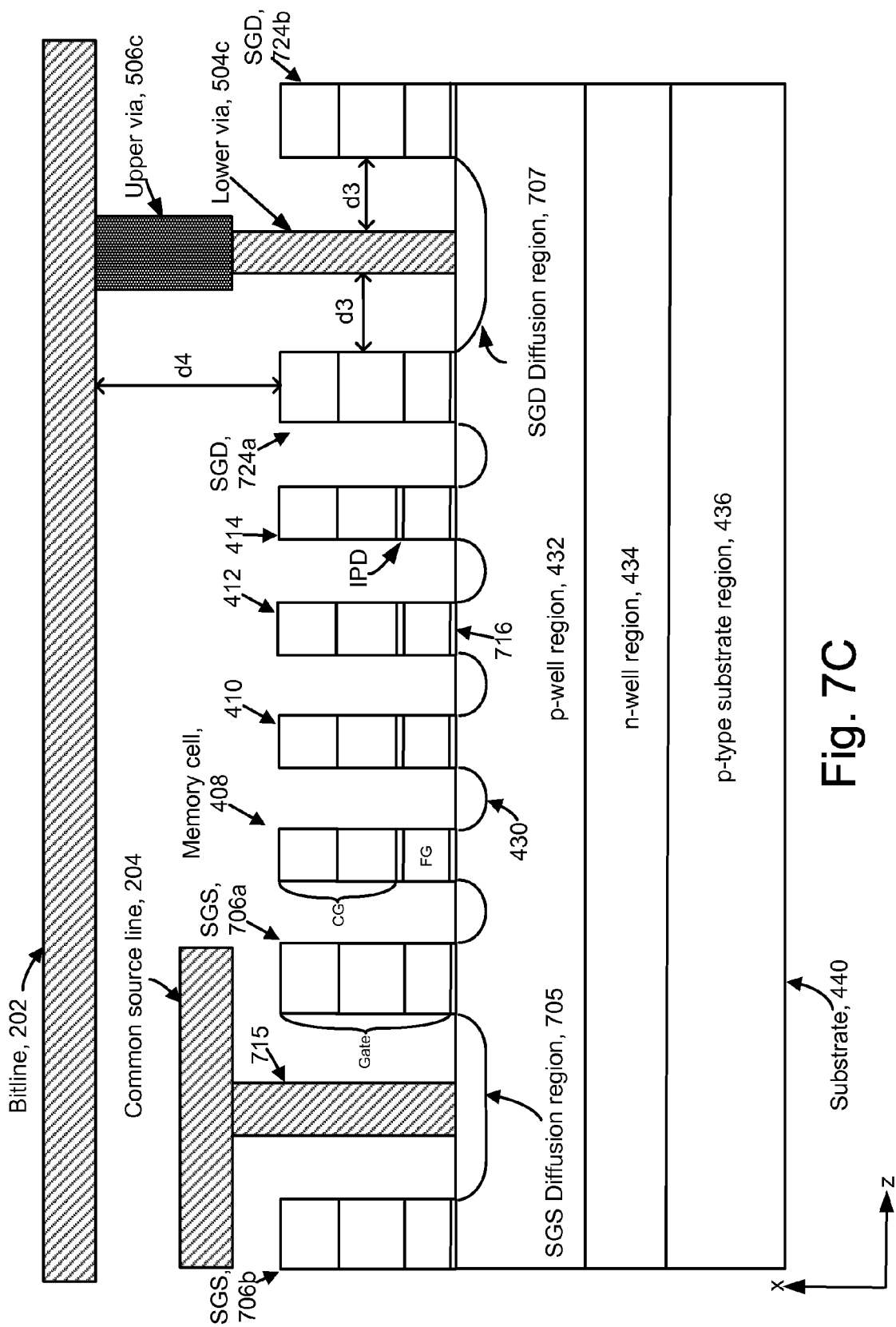

FIGS. 7A-7C depicts a cross-sectional view of a NAND string (and select gates of other NAND strings) formed on a substrate of memory cells having Type I (FIG. 7A), Type III (FIG. 7B), and Type II (FIG. 7C) bit line connections. The view is simplified and not to scale. The NAND string 150 includes a source-side select gate transistor 706a, a drain-side select gate transistor 724a, and four storage elements 408, 410, 412, 414, formed on a substrate 440. Typically, there are more than four storage elements in a NAND string. Also depicted are a source-side select gate 706b of a NAND string (not depicted) and a drain-side select gate 724b of another NAND string (not depicted). There is a SGD diffusion region 707 that is shared between the drain-side select gate 724a of the depicted NAND string 150 and the drain-side select gate 724b that is associated with a NAND string that is not depicted in FIG. 7A-7C. A bit line 202 above the NAND string 150 (and other NAND strings not depicted in FIGS. 7A-7C) is connected to the SGD diffusion region 707 by one of the types of bit line connections (Type I, II, or III). Thus, in one SGD diffusion region 707 there is one bit line connection, in this embodiment.

The common source line 204 is connected to the SGS diffusion region 705 by the source line contact 715. A number of memory cell source/drain regions, one example of which is source/drain region 430, are provided on either side of each storage element. In some embodiments, there is a gate oxide layer 716 (one of which is pointed out) between the substrate 440 and each memory cell, as well as between the substrate 440 and each select gate transistor 706, 724. A memory cell may include a floating gate (FG) and a control gate (CG) with an inter-poly dielectric (IPD) therebetween. Note that the control gate or word line may be shared with many other memory cells on different NAND strings (see FIG. 3B, for example).

In some embodiments, the floating gate is formed from polysilicon. The control gate may have a lower portion formed from polysilicon and an upper portion formed from metal (e.g., silicided cobalt). Therefore, the control gates are depicted as having an upper and lower portions, although they may have more or fewer portions. Moreover, floating gates and control gates can be formed from other materials. One example of an IPD is alternating layers of silicon dioxide (O) and silicon nitride (N). In one embodiment, the IPD is NONON. However, the IPD can be formed from other materials.

The select gates 706, 724 may be formed during the same fabrication process as the memory cells. Therefore, at least some of the same materials used to form the memory cells may be used to form the select gates. As such, the select gates 706, 724 are depicted as having three portions, which correspond to the floating gate portion of the memory cells, and the upper and lower portions of the control gates. However, select gates do not require an IPD. Therefore, no IPD has been shown in the select gates 706, 724. However, in some embodiments, a portion of the IPD may remain in the select gates 706, 724, so long as the IPD does not prevent good electrical connection between the upper and lower portions of the gates of the select gate transistors.

In one approach, the substrate 440 employs a triple-well technology which includes a p-well region 432 within an n-well region 434, which in turn is within a p-type substrate region 436. The NAND string and its non-volatile storage elements can be formed, at least in part, on the p-well region.

In operation, a potential may be provided to the common source line 204. In addition, the bit line 202 may be provided with a potential. Voltages, such as body bias voltages, can also be applied to the p-well region 432 and/or to the n-well region 434. During operation, a control gate voltage may be provided on a selected word line. During operation, a select voltage may be provided on the drain side select gate 724a to connect the NAND string 150 to the bit line 202. Therefore, different NAND strings 150 that are connected to the same bit line 202 may be operated independently of each other. During operation, a select voltage may be provided on the source side select gate 706a to connect the NAND string to the common source line 204.

In FIG. 7A, metal pad 502a of the type I connection is shown as extending over the top of the drain side select gate transistor 724a of the NAND string 150. In FIG. 7B, metal pad 502b of the type III connection is shown as extending over the top of the drain side select gate transistor 724b that is associated with the next NAND string (not depicted in FIG. 7B). The type II connection depicted in FIG. 7C does not have a metal pad; and therefore, does not extend over the top of any select gate transistor.

Note that the different capacitance may occur as a result of the different types of connections, as the following discussion will illustrate. First, note that the lower via 504c of a type II connection is "d3" units to each of the nearby select gates transistors 724a, 724b. However, for a type I and III connection, the lower vias 504a, 504b are "d1" units to the closest select gate transistor. For some embodiments, this may lead to a greater capacitance for the type I and III type connections. Moreover, since the metal pad 502 may reside above the gate of the drain side select gate transistor 724, there may be a relatively small gap of "d2" between the top of transistor 724 and metal pad 502 for type I and III connections. Also note that the metal pad 502 could be relatively wide. On the other hand, for type II connections, there is no metal pad. Therefore, the top of the drain side select gate transistor 724 has a relatively large gap of "d4" to the bit line 202. Given the close proximity of the metal pad 502 to the select gate transistor 724 and its relative width, there may be significantly more capacitance for Type I and III connections than for Type II connections. Note that memory array performance could be comprised if uneven capacitance were allowed to occur.

Figure 8:
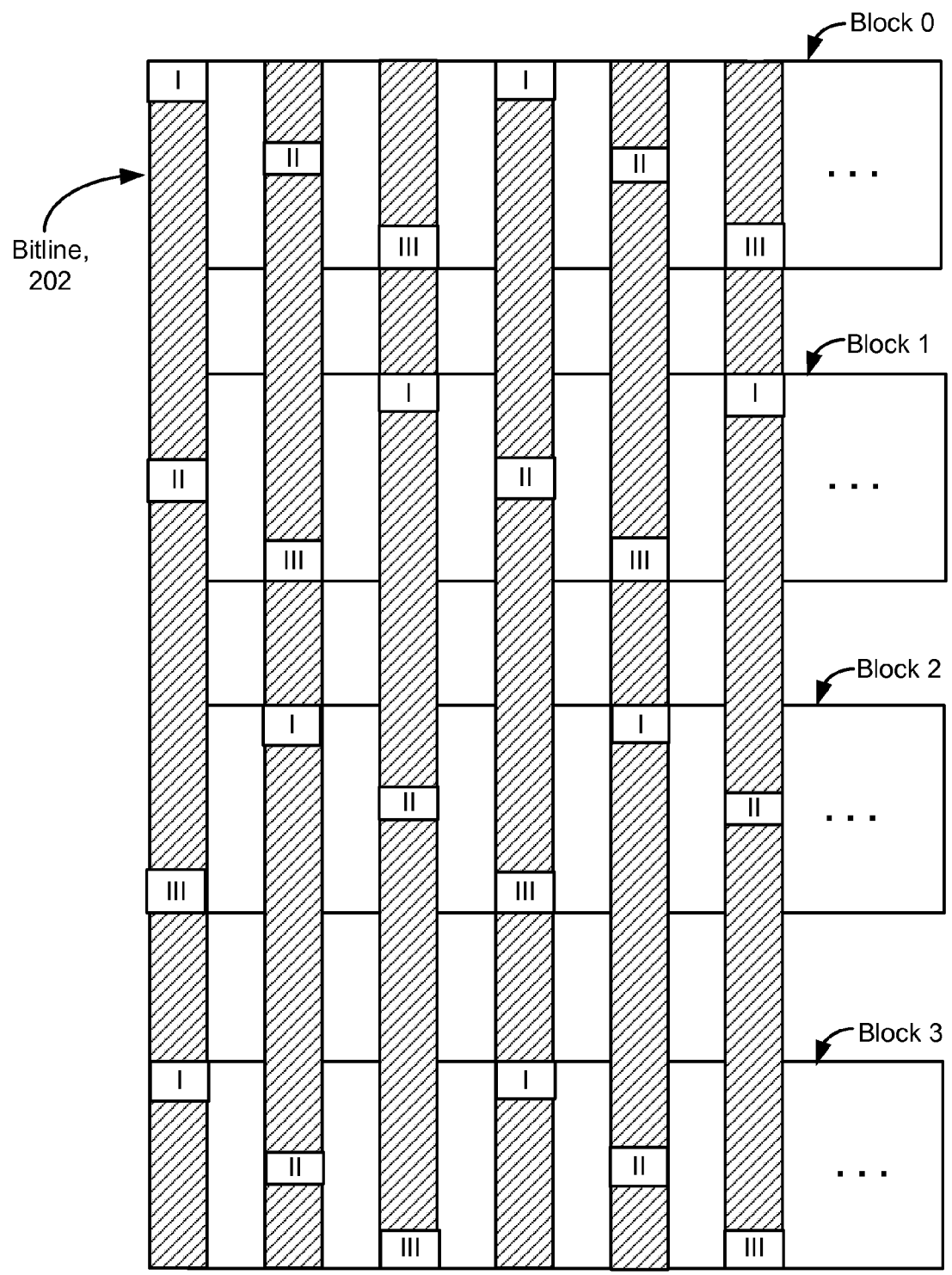
FIG. 8 depicts one embodiment of sequentially alternating Type I, II, and III connections.

However, by alternating the type I, II, and III type bit line connections sequentially, the amount of capacitance can be equalized. FIG. 8 depicts one example of sequentially alternating Type I, II, and III connections. FIG. 8 shows four blocks and six (of the many) associated bit lines 202. The diagram is not shown to scale. A given bit line 202 is associated with numerous blocks, as depicted. The diagram shows that within a given block, the bit line connections may alternate sequentially in the order Type I, Type II, Type III, Type I, Type II, Type III, etc. Therefore, although different types of bit line connections may lead to different capacitance, this may be equalized within a block by having about the same number of each type of connection in a block. There is also equalization of capacitance in local areas due to the sequential alternation.

Also, from one block to the next block, the connections may alternate sequentially in the order Type I, Type II, Type III, Type I, Type II, Type III, etc. For example, the first bit line has a Type I connection in block 0, Type II connection in block 1, Type III connection in block 2, a Type I connection in block 3, etc. Therefore, although different types of bit line connections may lead to different capacitance, this may be equalized along a bit line by having about the same number of each type of connection on each bit line. There is also equalization of capacitance in local areas due to the sequential alternation. Note that it is not a requirement that the types of bit line connections alternate sequentially from one block to the next. As one example, the first bit line in the first 100 blocks might have Type I connections, the first bit line in the second 100 blocks might have Type II connections, the first bit line in the third 100 blocks might have Type III connections, etc. Therefore, the number of each type of bit line connection can be approximately the same along a given bit line, even if the sequence does not alternate.

Figure 9:
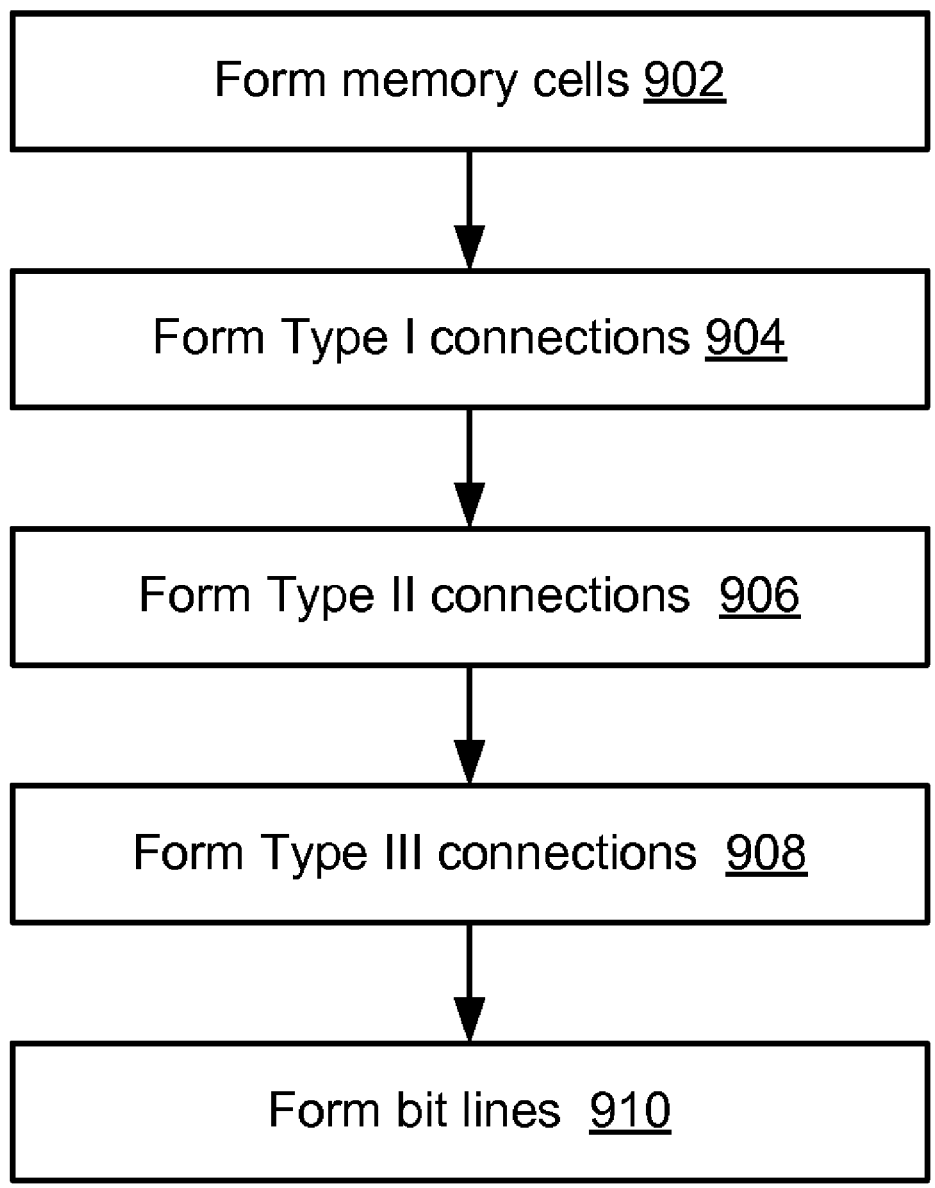
FIG. 9 depicts one embodiment of a process flow for fabricating different types of connections in a memory array.

FIG. 9 depicts one embodiment of a process flow for fabricating different types of bit line connections in a memory array. In step 902, memory cells are formed. In some embodiments, a number of NAND strings are formed. However, note that the process is not limited to forming bit line connections to NAND strings. Because formation of memory cells is well know and there are many different techniques for forming memory cells, step 902 will not be discussed in detail. Briefly, step 902 may includes forming a string of floating gates, forming IPD, forming control gates, and performing source/drain implants for memory cells, among other steps. Note that the select gate transistors 706, 724 may be formed while forming the memory cell. Note also that the SGD and SGS diffusion regions 707, 705 may also be formed in step 902.

Steps 904-908 includes forming a first type of bit line connections (Type I), a second type of bit line connections (Type II) and a third type of bit line connections (Type III). For purposes of explanation, forming each type of bit line connection will be described as a separate step. However, it will be appreciated that the three types of bit line connections may be formed during the same process steps.

Step 904 includes forming Type I connections. In one embodiment, step 904 includes forming Type I connections arranged in a first row that runs in a first direction (e.g., y-direction). The first type of bit line connections may include a lower portion 504a coupled to a first group of the non-volatile storage elements. For example, the lower portion may be connected to an SGD diffusion region 707. The first type of bit line connections may include a middle portion (e.g., metal pad 502a) formed in a metal layer (e.g., metal 0). The first type of bit line connections may include an upper portion (e.g., upper via 506a). Note that the middle portion 502a may be formed such that it extends away from Type II bit line connections.

Step 906 includes forming Type II connections. In one embodiment, step 906 includes forming Type II bit line connections arranged in a second row that runs in the first direction. In other words, they may run parallel to the Type I connections. However, they are on a different line such that the Type I and II connections can be staggered. The second type of connections may include a lower portion (e.g., lower via 504c) that is coupled to a second group of the non-volatile storage elements. For example, the lower vias 504c may be connected to SGD diffusion region 707 that are associated with different NAND strings than the Type I connections are associated with. The second type of bit line connections may include an upper portion or upper via 506c coupled to the lower portion.

Step 908 includes forming Type III connections. In one embodiment, step 908 includes forming Type III connections arranged in a third row that runs in the first direction (e.g., y-direction). The third type of bit line connections may include a lower portion 504b coupled to a third group of the non-volatile storage elements. For example, the lower portion may be connected to an SGD diffusion region 707. The third type of connections may include a middle portion (e.g., metal pad 502b) formed in the second metal layer (e.g., metal 0). The third type of connections may include an upper portion (e.g., upper via 506b). Note that the middle portion 502b may be formed such that it extends away from the Type II connections.

In some embodiments, the Type I, II, and III bit line connections alternate sequentially from one SGD diffusion region 707 to the next, as depicted in FIG. 5, for example.

Step 910 includes forming bit lines 202. Step 910 may include forming the bit lines such that each of the upper vias 506 make an electrical connection to one of the bit lines 202. Formation of bit lines 202 is known in the art and will not be discussed in detail. Since the Type I, II, and III bit line connections may alternate sequentially from one SGD diffusion region 707, they may also alternate sequentially from one bit line to the next bit line.

Figure 10:
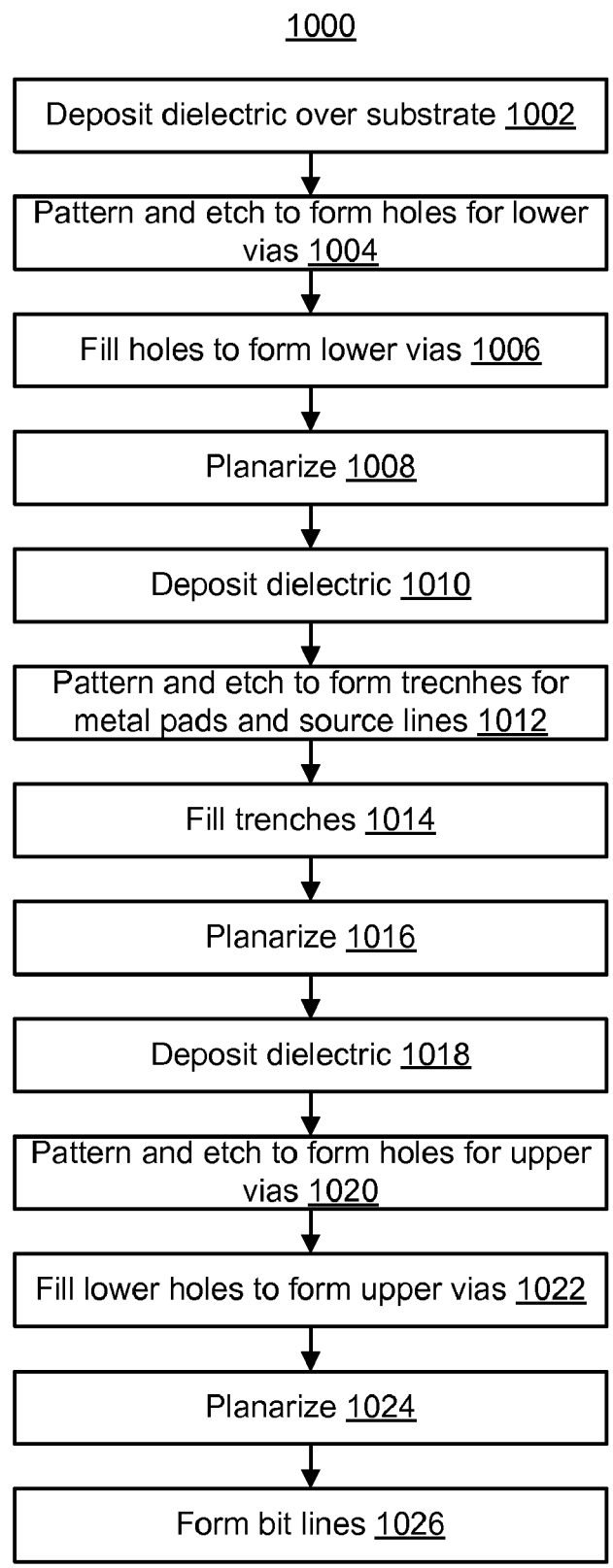
FIG. 10 depicts one embodiment of a process flow for fabricating a Type I connection.

FIG. 10 depicts one embodiment of a process 1000 flow for fabricating a Type I bit line connection. FIG. 10 shows further details of step 904 of FIG. 9. FIGS. 11A-11G depict results of forming a Type I bit line connections after various steps of process 1000. In step 1002, a dielectric region is formed over the substrate. For example, a material such as silicon dioxide is deposited. The memory cells and select gate transistors may be covered during this step.

In step 1004, patterning and etching is performed to form holes for the lower vias 504a. Patterning and etching may involve depositing a layer of photoresist. Then, the photoresist may be patterned by an exposure and development process. Specifically, a pattern may be formed on the photoresist by exposing the photoresist to light through a mask (or reticle) using a photo lithography tool. Then, a portion of the photoresist is removed leaving the pattern. Note that the lower vias 504a may be formed using a single exposure technique.

Figure 11A:
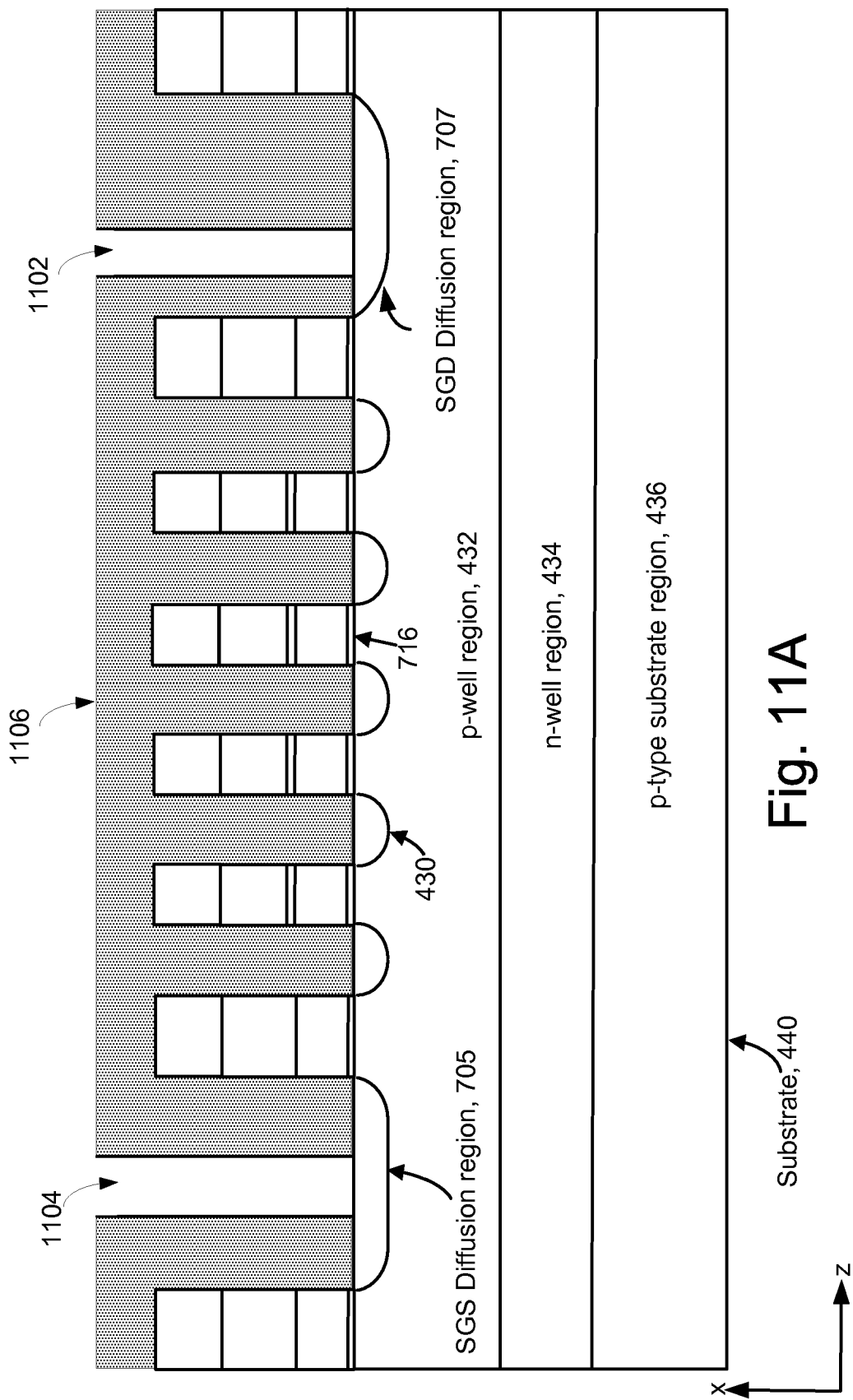
FIGS. 11A, 11B, 11C, 11D, 11E, 11F, and 11G depict results of forming a Type I connection after various steps of the process of FIG. 10.

Note that, in some embodiments, patterning and etching may be performed for holes for the lower vias 504b, 504c of the Type II and III connections during step 1004; although this is not a requirement. Also note that holes may be formed for source line contacts during step 1004, if desired. FIG. 11A depicts results after step 1004. Specifically, FIG. 11A depicts a hole 1102 for the lower via 504a of the Type I connection and a hole 1104 for a source line contact formed in a dielectric 1106.

In step 1006, the holes are filled to form the lower vias 504a of the Type I connections. Step 1006 may also include filling holes 1104 to form source line contacts. Also, holes may be filled to form lower vias 504b for Type II connections and lower vias 504c for Type III connections. An example material for filling the holes is tungsten. However, the holes could be filled with another metal, doped polysilicon, or a combination of materials.

Figure 11B:
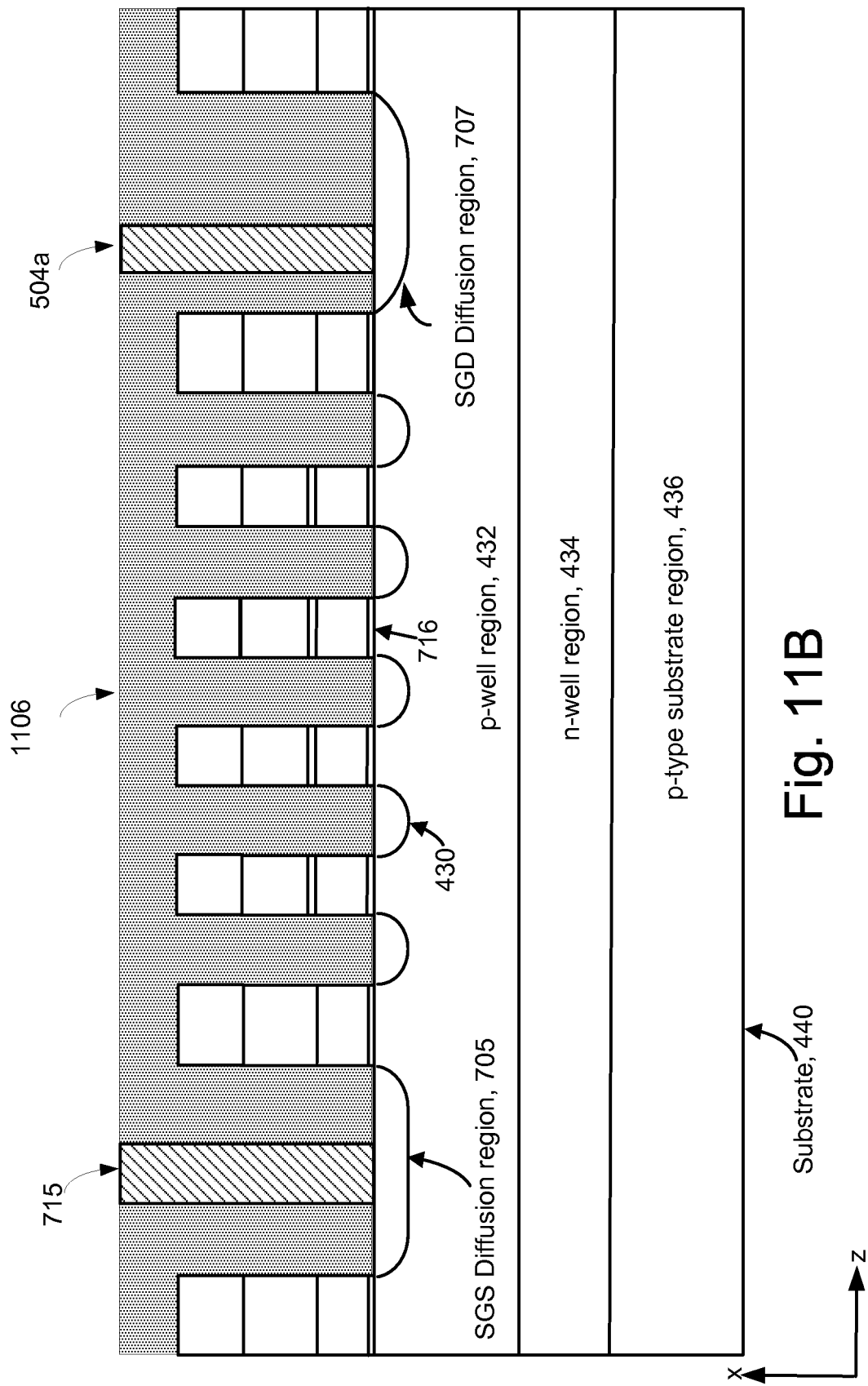

In step 1008, planarizing is performed to remove excess fill material from step 1006. As one example, chemical mechanical polishing (CMP) is performed. FIG. 11B depicts results after step 1008 showing the lower via 504a and the source line contact 715. Note the forming of the lower via 504a does not require the use of spacers.

In step 1010, a dielectric region is formed in order to provide a region in which to form metal pads 502. For example, a material such as silicon dioxide is deposited. In step 1012, patterning and etching is performed to form trenches for the metal pads 502a. Patterning and etching may involve depositing a layer of photoresist. Then, the photoresist may be patterned by an exposure and development process. Specifically, a pattern may be formed on the photoresist by exposing the photoresist to light through a mask (or reticle) using a photo lithography tool. Then, a portion of the photoresist is removed leaving the pattern. Note that the metal pads 502a may be formed using a single exposure technique.

Figure 11C:
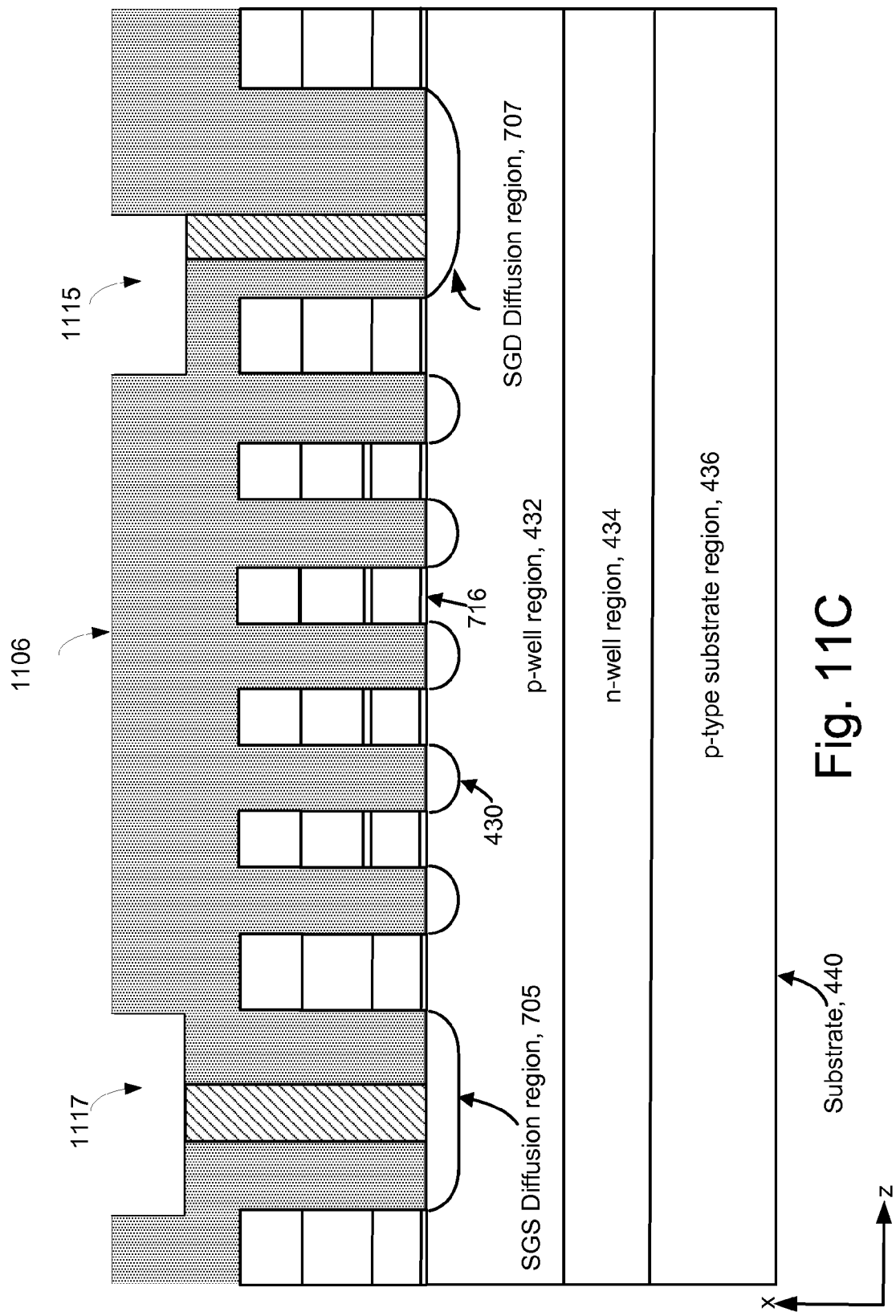

Note that in some embodiments patterning and etching may be performed for holes for the metal pads 502b for the Type III connections at this time; although this is not a requirement. Also note that trenches may be formed for source lines 204, if desired. FIG. 11C depicts results after step 1012. Specifically, FIG. 11C depicts a trench 1115 for the metal pad 502a of the Type I connection and a trench 1117 for a source line formed in a dielectric 1106.

In step 1014, the trenches 1115 are filled to form the metal pads 502a of the Type I connections. Step 1116 may also include filling trenches 1117 to form source lines 204. Also, trenches may be filled to form metal pads 502b for Type III connections. An example material for filling the trenches is tungsten. However, the trenches could be filled with another metal, doped polysilicon, or a combination of materials.

Figure 11D:
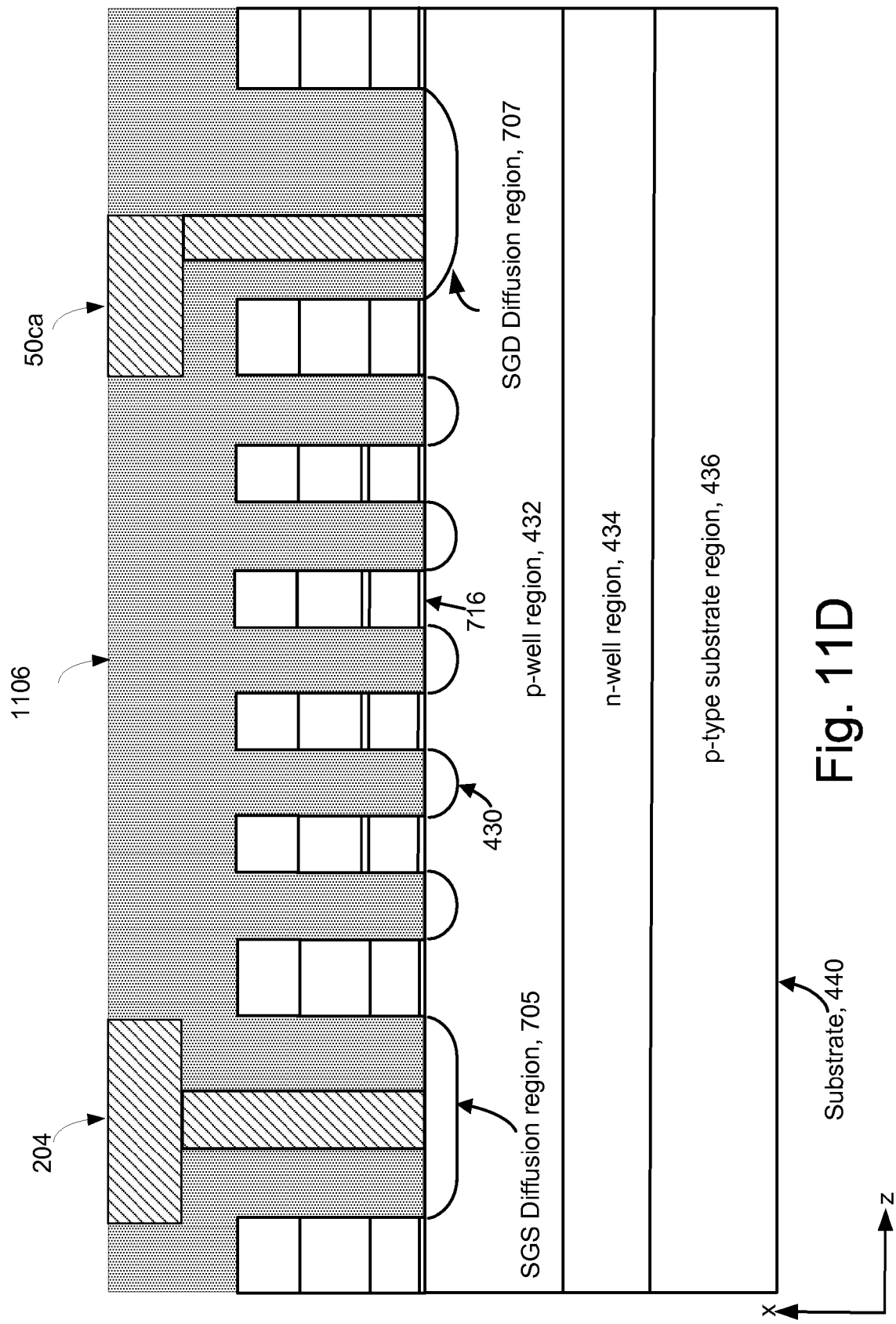

In step 1016, planarizing is performed to remove excess fill material from step 1116. As one example, chemical mechanical polishing (CMP) is performed. FIG. 11D depicts results after step 1016 showing the metal pad 502a and the source line 204. Note that forming of the metal pad 502a does not require the use of spacers.

In step 1018, a dielectric region is formed such that upper vias 506 may be formed. For example, a material such as silicon dioxide may be deposited. In step 1020, patterning and etching is performed to form holes for the upper vias 506a. Patterning and etching may involve depositing a layer of photoresist. Then, the photoresist may be patterned by an exposure and development process. Specifically, a pattern may be formed on the photoresist by exposing the photoresist to light through a mask (or reticle) using a photo lithography tool. Then, a portion of the photoresist is removed leaving the pattern. Note that the upper vias 506a may be formed using a single exposure technique.

Figure 11E:
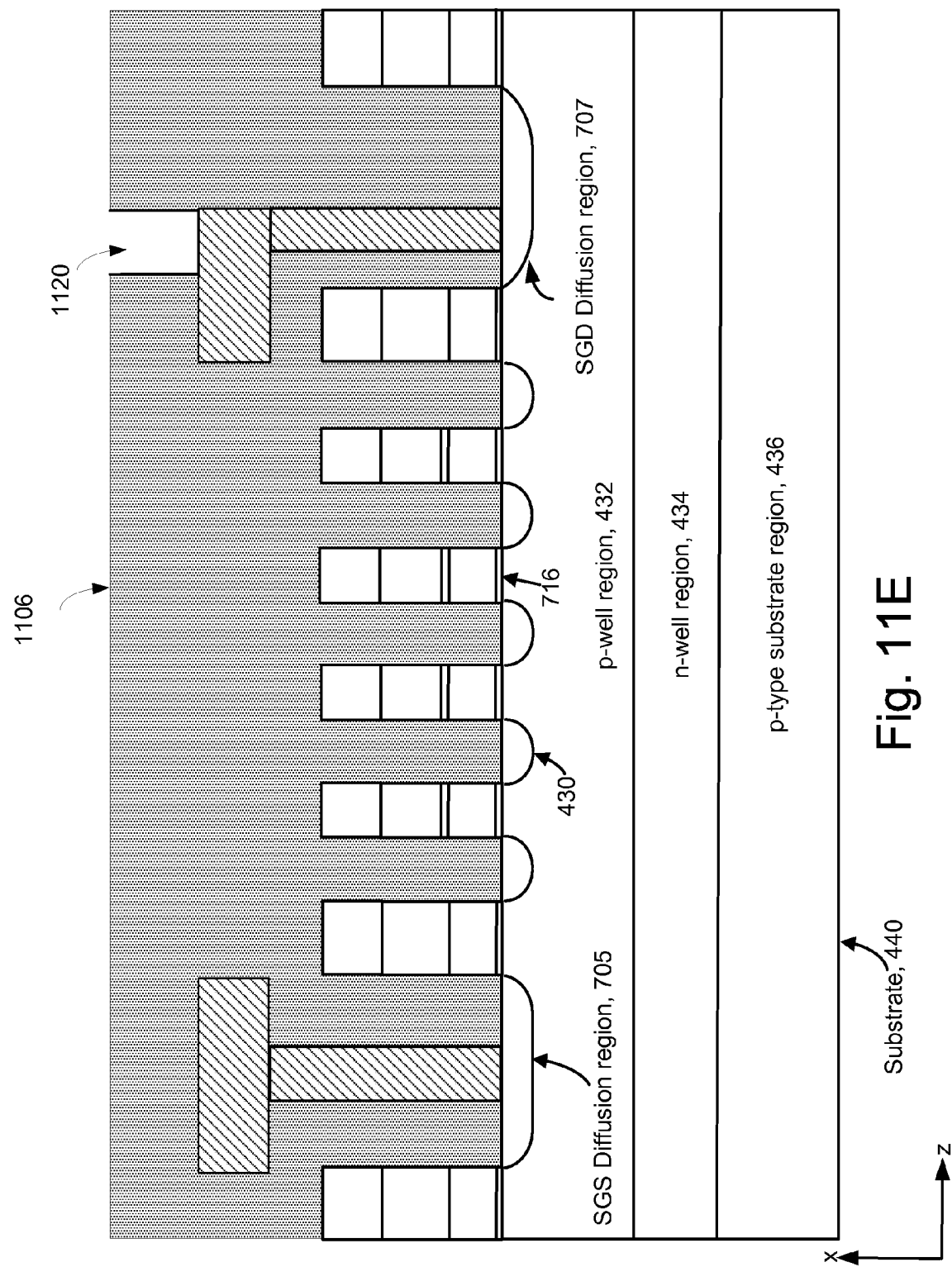

Note that in some embodiments patterning and etching may be performed for holes for the upper vias 506b, 506c of the Type II and III connections at this time; although this is not a requirement. Therefore, holes for all of the upper vias 506 may be formed using a single exposure without the use of spacers. FIG. 11E depicts results after step 1020. Specifically, FIG. 11E depicts a hole 1120 for the upper via 506a of the Type I bit line connection formed in a dielectric 1106.

In step 1022, the holes are filled to form the upper vias 506a of the Type I connections. Step 1022 may also include filling holes to form upper vias 506b for Type II connections and upper vias 506c for Type III connections. An example material for filling the holes is tungsten. However, the holes could be filled with another metal, doped polysilicon, or a combination of materials.

Figure 11F:
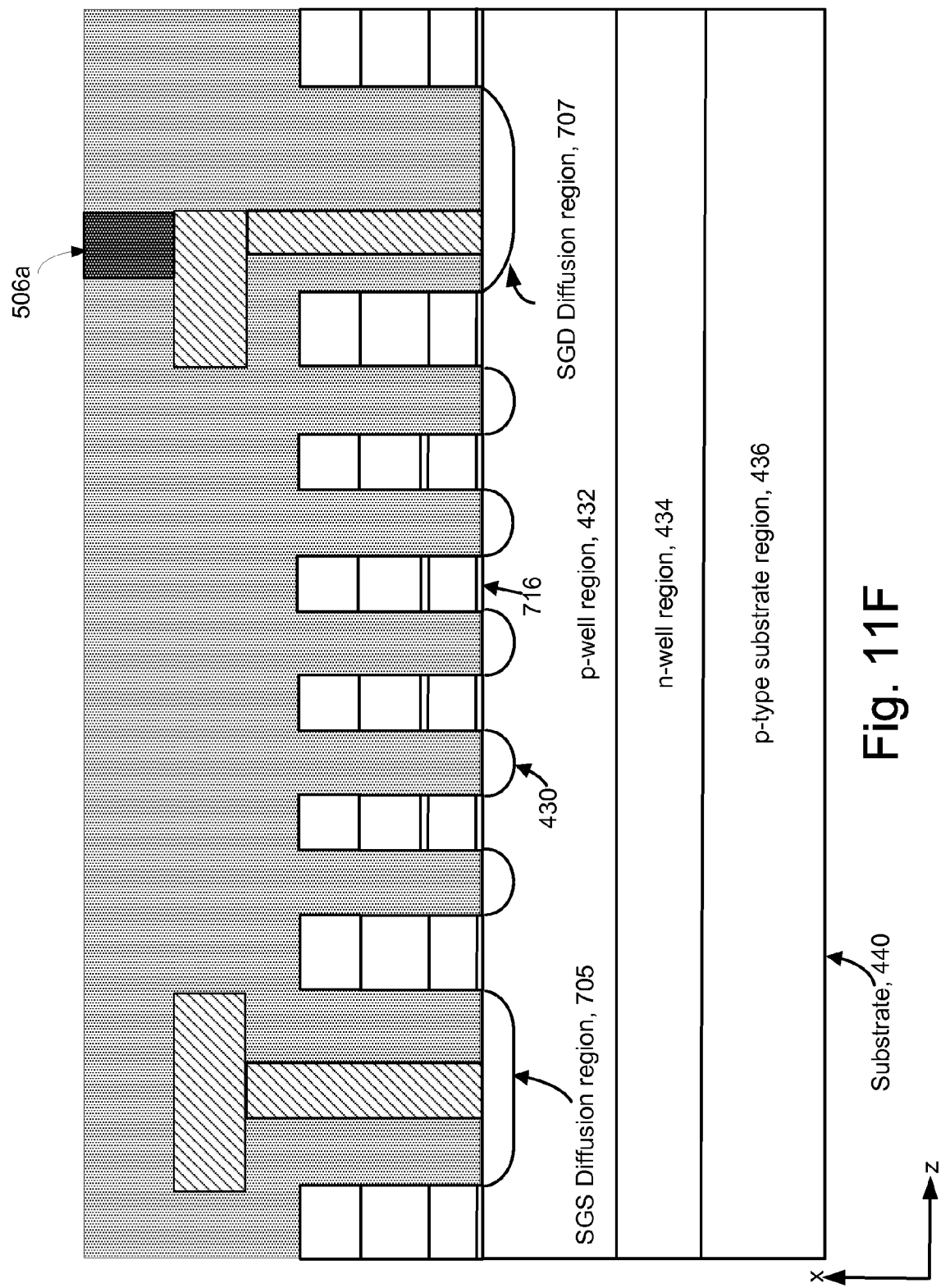
Figure 11G:
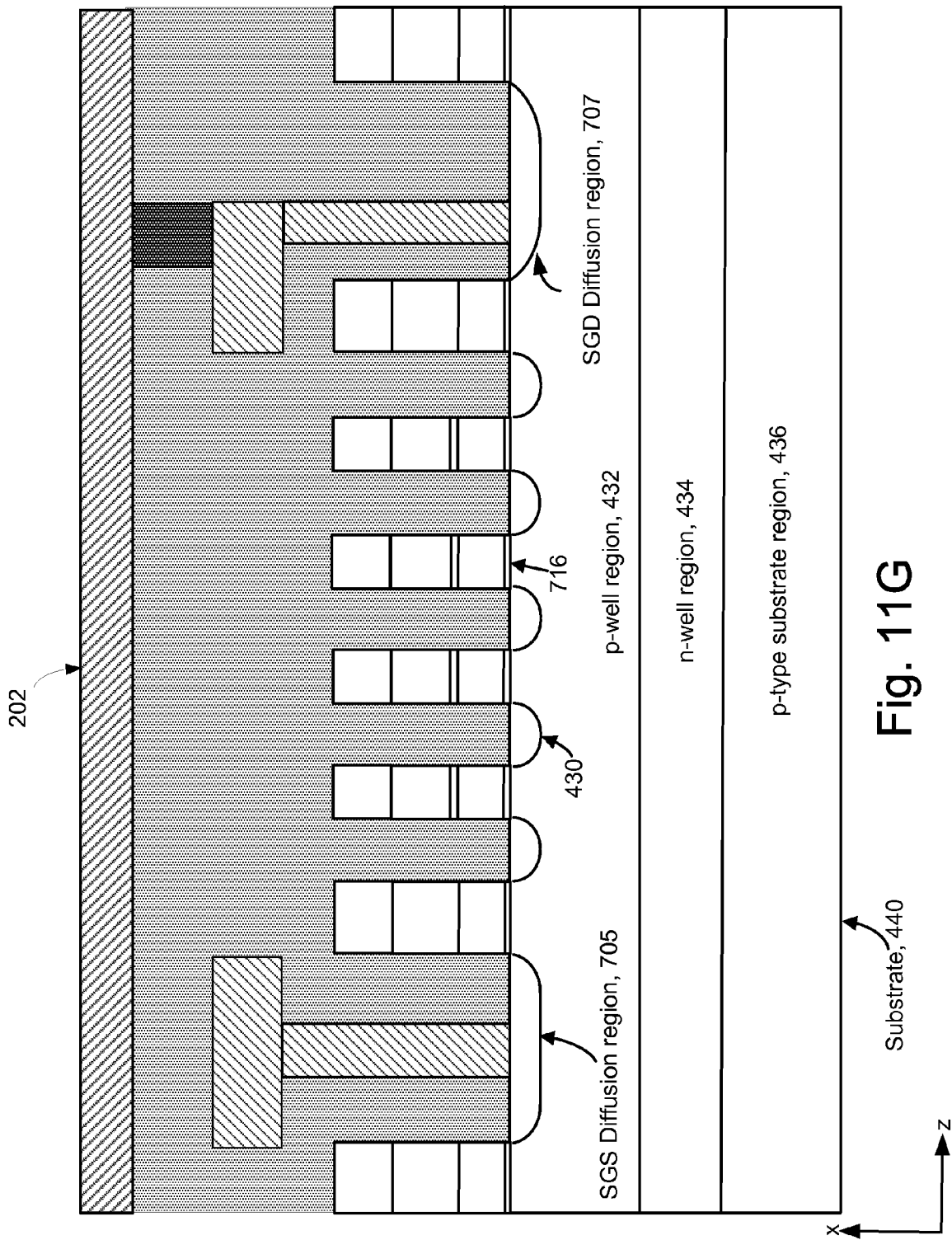

In step 1024, planarizing is performed to remove excess fill material from step 1022. As one example, chemical mechanical polishing (CMP) is performed. FIG. 11F depicts results after step 1024 showing the upper via 506a. Note the forming of the upper via 506a does not require the use of spacers. After step 1024, the bit lines 202 may be formed, as discussed in step 910 of FIG. 9. Results are depicted in FIG. 11G.

Note that process 1000 was discussed as performing three single damascene processes. For example, one single damascene process was used to form the lower via 504a, another single damascene process was used to form the metal pad 502a, and a third single damascene process was used to form the upper via 506a. As mentioned, the first single damascene process could be used to form all of the lower vias 504a, 504b, 504c. The second single damascene process could be used for form all metal pads 502a, 502b. The third single damascene process could be used to form all of the upper vias 506a, 506b, 506c.

However, one or more dual damascene processes may be used in forming the Type I contact, the Type II contact, and/or the Type III contact. For example, a dual damascene process may be used to form both the lower via 504a and the metal pad 502a of the Type I connections. Note the lower via 504b and the metal pad 502b of the Type III connections could be formed in the same, or another dual damascene process. The lower vias 502c of the type II connections may also be formed during the dual damascene process (but without forming a metal pad for the Type II connection).

One embodiment includes a non-volatile storage device, including a plurality of non-volatile storage elements formed on a semiconductor substrate. The non-volatile storage elements are divided into a plurality of groups. The device also includes a plurality of bit lines formed in a first metal layer over the semiconductor substrate. The device also includes a plurality of first type of connections arranged in a first row that runs in a first direction perpendicular to the bit lines. The first type of connections includes a lower portion coupled to a first group of the non-volatile storage elements. The first type of connections includes a middle portion formed in a second metal layer. The middle portion is coupled to the lower portion. The first type of connections includes an upper portion that is coupled between the middle portion and one of the bit lines. The device also includes a plurality of second type of connections arranged in a second row that runs in the first direction. The second type of connections includes a lower portion that is coupled to a second group of the non-volatile storage elements. The second type of connections includes an upper portion coupled between the lower portion and one of the bit lines. Each connection of the second type of connections is coupled to a bit line that is adjacent to a bit line coupled to one of the first type of connections. The middle portion of the first type of connection extends away from the lower portion of the first type of connection in a second direction that is away from the second type of connection.

In one embodiment, the device of the previous paragraph also includes a plurality of third type of connections arranged in a third row that runs in the first direction. The third type of connections includes a lower portion coupled to a third group of the non-volatile storage elements. The third type of connections includes a middle portion formed in the second metal layer. The middle portion is coupled to the lower portion. The third type of connections includes an upper portion that is coupled between the second portion and one of the bit lines. The middle portion of the third type of connection extends away from the lower portion of the third type of connection in a third direction away from the second type of connection. The second direction is opposite the third direction, the first type. The first type, the second type and the third type of connections may alternate sequentially from group of non-volatile storage elements to the adjacent group of non-volatile storage elements.

One embodiment includes a method of forming a non-volatile storage device including forming a plurality of non-volatile storage elements on a semiconductor substrate. The plurality of non-volatile storage elements are arranged as groups. The method also includes forming a plurality of first type of connections arranged in a first row that runs in a first direction. The first type of connections includes a lower portion coupled to a first group of the non-volatile storage elements. The first type of connections includes a middle portion formed in a metal layer, the middle portion is coupled to the lower portion. The first type of connections includes an upper portion. The method also includes forming a plurality of second type of connections arranged in a second row that runs in the first direction. The second type of connections includes a lower portion that is coupled to a second group of the non-volatile storage elements. The second type of connections includes an upper portion coupled to the lower portion. The middle portion of the first type of connection extends away from the lower portion of the first type of connection in a second direction that is away from the second type of connection. The method also includes forming a plurality of bit lines in electrical connection with the first type and second type of connections. Each connection of the second type of connections is coupled to a bit line that is adjacent to a bit line coupled to one of the first type of connections.

In one embodiment, the method of the previous paragraph further includes forming a plurality of third type of connections arranged in a third row that runs in the first direction. The third type of connections includes a lower portion coupled to a third group of the non-volatile storage elements. The third type of connections includes a middle portion formed in the second metal layer, the middle portion is coupled to the lower portion. The third type of connections includes an upper portion that is coupled between the second portion and one of the bit lines. The middle portion of the third type of connection extends away from the lower portion of the third type of connection in a third direction away from the second type of connection. The second direction is opposite the third direction, the first type. The second type and the third type of connections may alternate sequentially from group of non-volatile storage elements to the adjacent group of non-volatile storage elements.

One embodiment includes a non-volatile storage device including a plurality of NAND strings formed on a semiconductor substrate. Each NAND string includes a plurality of non-volatile storage elements and at least one of select gate transistor. The select gate transistors are arranged in a plurality of rows that are perpendicular to the NAND strings. A first row of the select gate transistors is adjacent to a second row of the select gate transistors. The device also includes a plurality of bit lines formed in a first metal layer over the semiconductor substrate. The device also includes a plurality of first type of bit line connections. Each first type of bit line connection includes a first lower via coupled to a first of the NAND strings, a first upper via coupled to a first of the bit lines, and a first metal pad between the first lower via and the first upper via. The first metal pad is in a second metal layer. The first metal pad extends over one of the select gate transistors in the first row but not over any select gate transistor of the second row of the select gate transistors. The device also includes a plurality of second type of bit line connections. Each of the second type of bit line connections includes a second lower via coupled to a second of the NAND strings and a second upper via coupled to a second of the bit lines. The second type of connection does not include a metal pad in the second metal layer. The device also includes a plurality of third type of bit line connections. Each of the third type of connections includes a third lower via coupled to a third of the NAND strings, a third upper via coupled to a third of the bit lines, and a second metal pad between the third lower via and the third upper via. The second metal pad is in the second metal layer. The second metal pad extends over one of the select gate transistors in the second row but not over any of the select gate transistors in the first row of select gate transistors. The first type, the second type and the third type of connections alternate sequentially from one NAND string to the adjacent NAND string.

One embodiment includes a method of forming a non-volatile storage device, including forming a plurality of NAND strings on a semiconductor substrate. Each NAND string including a plurality of non-volatile storage elements and at least one of select gate transistor. The select gate transistors are arranged in a plurality of rows that are perpendicular to the NAND strings. A first row of the select gate transistors is adjacent to a second row of the select gate transistors. The method also includes forming lower vias for first, second and third types of bit line connections. The lower vias are formed between the first and second rows of select gate transistors. The method also includes forming first metal pads coupled to the lower vias for the first type of bit line connections while forming second metal pads coupled to the lower vias for the second type of bit line connections, but not forming metal pads for the second type of bit line connections. The first metal pads extend over tops of respective ones of the first row of select gate transistors but not over tops any of the second row of select gate transistors. The second metal pads extend over tops of respective ones of the second row of select gate transistors but not over tops of any of the first row of select gate transistors. The method also includes forming upper vias coupled to the first metal pads, the second metal pads, and the lower vias of the second type of connections. The method also includes forming a plurality of bit lines coupled to the upper vias of the first, second, and third type of connections. The first type, the second type and the third type of bit line connections alternate sequentially from one NAND string to the adjacent NAND string.

The foregoing detailed description of embodiments has been presented for purposes of illustration and description. It is not intended to be exhaustive or to limit embodiments to the precise form disclosed. Many modifications and variations are possible in light of the above teaching. The described embodiments were chosen in order to best explain the principles practical applications, to thereby enable others skilled in the art to best utilize embodiments and with various modifications as are suited to the particular use contemplated. It is intended that the scope be defined by the claims appended hereto.

What is claimed is:
1. A non-volatile storage device, comprising:
a plurality of non-volatile storage elements formed on a semiconductor substrate, the non-volatile storage elements are divided into a plurality of groups;

a plurality of bit lines formed in a first metal layer over the semiconductor substrate;

a plurality of first type of connections arranged in a first row that runs in a first direction perpendicular to the bit lines, the first type of connections includes a lower portion coupled to a first group of the non-volatile storage elements, the first type of connections includes a middle portion formed in a second metal layer, the middle portion is coupled to the lower portion, the first type of connections includes an upper portion that is coupled between the middle portion and one of the bit lines;

a plurality of second type of connections arranged in a second row that runs in the first direction, the second type of connections includes a lower portion that is coupled to a second group of the non-volatile storage elements, the second type of connections includes an upper portion coupled between the lower portion and one of the bit lines, each connection of the second type of connections is coupled to a bit line that is adjacent to a bit line coupled to one of the first type of connections, the middle portion of the first type of connection extends away from the lower portion of the first type of connection in a second direction that is away from the second type of connection and a plurality of third type of connections arranged in a third row that runs in the first direction, the third type of connections includes a lower portion coupled to a third group of the non-volatile storage elements, the third type of connections includes a middle portion formed in the second metal layer, the middle portion is coupled to the lower portion, the third type of connections includes an upper portion that is coupled between the second portion and one of the bit lines, the middle portion of the third type of connection extends away from the lower portion of the third type of connection in a third direction away from the second type of connection, the second direction is opposite the third direction, the first type, the second type and the third type of connections alternate sequentially from a group of non-volatile storage elements to the adjacent group of non-volatile storage elements.

2. The non-volatile storage device of claim 1 wherein the non-volatile storage elements are arranged in a plurality of blocks, a given one of the bit lines is associated with the plurality of blocks, the first type, the second type and the third type of connections alternate sequentially from one block to the adjacent block along the given bit line.

3. The non-volatile storage device of claim 2 further comprising a first row of select gate transistors and a second row of select gate transistors, the first type, the second type and the third type of connections connect to a substrate between the first and second rows of select gate transistors.

4. The non-volatile storage device of claim 3, wherein the middle portions of the first type of connections extend over tops of respective ones of the first row of select gate transistors but not over tops any of the second row of select gate transistors, the middle portions of the second type of connections extend over tops of respective ones of the second row of select gate transistors but not over tops any of the first row of select gate transistors.

5. The non-volatile storage device of claim 1 wherein the upper portion of the first type of connections is formed entirely over a region of the middle portion of the first type of connection that is not over the lower portion of the first type of connection.

6. The non-volatile storage device of claim 5 wherein the upper portion of the second type of connection is substantially centered over the lower portion of the second type of connection.

7. The non-volatile storage device of claim 1 wherein the upper portion of first type of connection has a central vertical axis that is further from a central vertical axis of the upper portion of the second type of connection than a central vertical axis of the lower portion of the first type of connection is from a central vertical axis of the lower portion of the second type of connection.

8. A method of forming a non-volatile storage device, comprising:

forming a plurality of non-volatile storage elements on a semiconductor substrate, the plurality of non-volatile storage elements are arranged as groups;

forming a plurality of first type of connections arranged in a first row that runs in a first direction, the first type of connections includes a lower portion coupled to a first group of the non-volatile storage elements, the first type of connections includes a middle portion formed in a metal layer, the middle portion is coupled to the lower portion, the first type of connections includes an upper portion; and forming a plurality of second type of connections arranged in a second row that runs in the first direction, the second type of connections includes a lower portion that is coupled to a second group of the non-volatile storage elements, the second type of connections includes an upper portion coupled to the lower portion, the middle portion of the first type of connection extends away from the lower portion of the first type of connection in a second direction that is away from the second type of connection;

forming a plurality of bit lines electrically connected with the first type and second type of connections, each connection of the second type of connections is coupled to a bit line that is adjacent to a bit line coupled to one of the first type of connections; and forming a plurality of third type of connections arranged in a third row that runs in the first direction, the third type of connections includes a lower portion coupled to a third group of the non-volatile storage elements, the third type of connections includes a middle portion formed in the metal layer, the middle portion is coupled to the lower portion, the third type of connections includes an upper portion that is coupled between the second portion and one of the bit lines, the middle portion of the third type of connection extends away from the lower portion of the third type of connection in a third direction away from the second type of connection, the second direction is opposite the third direction, the first type, the second type and the third type of connections alternate sequentially from a group of non-volatile storage elements to the adjacent group of non-volatile storage elements.

9. The method of forming a non-volatile storage device of claim 8, wherein the forming a plurality of bit lines further includes forming the bits lines electrically connected to the third type of connections, the first type, the second type and the third type of connections alternate sequentially from one bit line to the next.

10. The method of forming a non-volatile storage device of claim 9, wherein forming the first and third type of connections includes forming the middle portions in the same metal layer as a common source line that is associated with the plurality of non-volatile storage elements.

11. The method of forming a non-volatile storage device of claim 10, further comprising forming a first row of select gate transistors and a second row of select gate transistors, the first type, the second type and the third type of connections connect to a substrate between the first and second rows of select gate transistors.

12. The method of forming a non-volatile storage device of claim 11, wherein the middle portions extend over tops of respective ones of the first row of select gate transistors but not over tops any of the second row of select gate transistors, the second first middle portions extend over tops of respective ones of the second row of select gate transistors but not over tops any of the first row of select gate transistors.

13. The method of forming a non-volatile storage device of claim 9 wherein forming the first type of connections and forming the second type of connections and forming the third type of connections includes forming holes for the lower portions of the first type of connections, forming holes for the lower portions of the second type of connections, and forming holes for the lower portions of the third type of connections using a single lithographic exposure.

14. The method of forming a non-volatile storage device of claim 9 wherein forming the first type of connections and forming the second type of connections and forming the third type of connections includes forming holes for the upper portions of the first type of connections, forming holes for the upper portions of the second type of connections and forming holes for the upper portions of the third type of connections using a single lithographic exposure.

15. A non-volatile storage device, comprising:
a plurality of NAND strings formed on a semiconductor substrate, each NAND string including a plurality of non-volatile storage elements and at least one of select gate transistor, the select gate transistors are arranged in a plurality of rows that are perpendicular to the NAND strings, a first row of the select gate transistors is adjacent to a second row of the select gate transistors;
a plurality of bit lines formed in a first metal layer over the semiconductor substrate;
a plurality of first type of bit line connections, each first type of bit line connection includes a first lower via coupled to a first of the NAND strings, a first upper via coupled to a first of the bit lines, and a first metal pad between the first lower via and the first upper via, the first metal pad is in a second metal layer, the first metal pad extends over one of the select gate transistors in the first row but not over any select gate transistor of the second row of the select gate transistors;
a plurality of second type of bit line connections, each of the second type of bit line connections includes a second lower via coupled to a second of the NAND strings and a second upper via coupled to a second of the bit lines, the second type of connection does not include a metal pad in the second metal layer; and
a plurality of third type of bit line connections, each of the third type of connections includes a third lower via coupled to a third of the NAND strings, a third upper via coupled to a third of the bit lines, and a second metal pad between the third lower via and the third upper via, the second metal pad is in the second metal layer, the second metal pad extends over one of the select gate transistors in the second row but not over any of the select gate transistors in the first row of select gate transistors;
the first type, the second type and the third type of connections alternate sequentially from one NAND string to the adjacent NAND string.

16. The non-volatile storage device of claim 15 wherein the plurality of NAND strings are arranged in a plurality of blocks, a given one of the bit lines is associated with the plurality of blocks, the first type, the second type and the third type of bit line connections alternate sequentially from one block to the adjacent block along the given bit line.

17. The non-volatile storage device of claim 15 wherein the plurality of NAND strings are associated with a common source line that is in the second metal layer.

18. The non-volatile storage device of claim 15 wherein the upper via of the first type of connection is formed entirely over the region of the metal pad of the first type of connection that extends laterally beyond the lower via of the first type of connection, the upper via of the third type of connection is formed entirely over the region of the metal pad of the third type of connection that extends laterally beyond the lower via of the third type of connection.

19. The non-volatile storage device of claim 18 wherein the upper via of the second type of connection is substantially centered over the lower via of the second type of connection.

20. The non-volatile storage device of claim 19 wherein for each of the first, second and third type of connections, the length of the upper vias in the direction of the bit lines is greater than the length of the lower vias the direction of the bit lines.

21. The non-volatile storage device of claim 20 wherein the upper vias of the first and third type of connections are offset to create at least as much space between upper vias of the second type of connection and adjacent upper vias of first and third type of connections as the space between lower vias of the second type of connections and adjacent lower vias of the first and third type of connections.

22. A method of forming a non-volatile storage device, comprising:
forming a plurality of NAND strings on a semiconductor substrate, each NAND string including a plurality of non-volatile storage elements and at least one of select gate transistor, the select gate transistors are arranged in a plurality of rows that are perpendicular to the NAND strings, a first row of the select gate transistors is adjacent to a second row of the select gate transistors;
forming lower vias for first, second and third type of bit line connections, the lower vias are formed between the first and second rows of select gate transistors;
forming first metal pads coupled to the lower vias for the first type of bit line connections while forming second metal pads coupled to the lower vias for the third type of bit line connections, but not forming metal pads for the second type of bit line connections, the first metal pads extend over tops of respective ones of the first row of select gate transistors but not over tops any of the second row of select gate transistors, the second metal pads extend over tops of respective ones of the second row of select gate transistors but not over tops of any of the first row of select gate transistors;
forming upper vias coupled to the first metal pads, the second metal pads, and the upper vias of the second type of connections; and
forming a plurality of bit lines coupled to the upper vias of the first, second, and third type of connections, the first type, the second type and the third type of bit line connections alternate sequentially from one NAND string to the adjacent NAND string.

23. The method of forming a non-volatile storage device of claim 22, further comprising forming a common source line associated with the plurality of NAND strings while forming the metal pads.

24. The method of forming a non-volatile storage device of claim 22 wherein forming the first type of bit line connections, forming the second type of bit line connections, and forming the third type of bit line connections includes forming holes for the lower portions of the first type of bit line connections, forming holes for the lower portions of the second type of bit line connections and forming holes for the lower portions of the third type of bit line connections using a single lithographic exposure.

25. The method of forming a non-volatile storage device of claim 22 wherein forming the first type of bit line connections, forming the second type of bit line connections, and forming the third type of bit line connections includes forming holes for the upper vias of the first type of bit line connections, forming holes for the upper vias of the second type of connection and forming holes for the upper vias of the third type of connections using a single lithographic exposure.

* * * * *